United States Patent
Yeo et al.

(10) Patent No.: US 9,301,389 B2
(45) Date of Patent: Mar. 29, 2016

(54) DISPLAY APPARATUS

(71) Applicant: SAMSUNG DISPLAY CO., LTD., Yongin, Gyeonggi-Do (KR)

(72) Inventors: Gilhwan Yeo, Yongin (KR); Jeongho Lee, Yongin (KR)

(73) Assignee: SAMSUNG DISPLAY CO., LTD., Yongin, Gyeongig-Do (KR)

( * ) Notice: Subject to any disclaimer, the term of this patent is extended or adjusted under 35 U.S.C. 154(b) by 79 days.

(21) Appl. No.: 14/132,168

(22) Filed: Dec. 18, 2013

(65) Prior Publication Data

US 2014/0340856 A1    Nov. 20, 2014

(30) Foreign Application Priority Data

May 14, 2013    (KR) .................... 10-2013-0054477

(51) Int. Cl.
| | |
|---|---|
| H05K 7/02 | (2006.01) |
| H05K 1/02 | (2006.01) |
| G02F 1/1333 | (2006.01) |

(52) U.S. Cl.
CPC ........ H05K 1/0281 (2013.01); *G02F 1/133305* (2013.01); *H05K 2201/2009* (2013.01)

(58) Field of Classification Search
CPC ................................ H05K 1/028; H05K 7/02
USPC ............... 361/749, 679.01, 600, 679.09, 681
See application file for complete search history.

(56) References Cited

U.S. PATENT DOCUMENTS

| | | | |
|---|---|---|---|
| 7,109,967 B2 | 9/2006 | Hioki et al. | |
| 7,523,856 B2 | 4/2009 | Block et al. | |
| 7,710,370 B2 * | 5/2010 | Slikkerveer | G09F 9/35 345/31 |
| 7,868,545 B2 * | 1/2011 | Hioki | G02F 1/133305 257/59 |
| 7,886,467 B2 | 2/2011 | Glass | |
| 8,098,486 B2 * | 1/2012 | Hsiao | G02F 1/133305 349/153 |
| 2004/0052044 A1 * | 3/2004 | Mochizuki et al. | 361/683 |
| 2008/0055831 A1 * | 3/2008 | Satoh | G02F 1/133305 361/600 |
| 2010/0117975 A1 | 5/2010 | Cho | |
| 2010/0208417 A1 | 8/2010 | Visser et al. | |
| 2012/0283878 A1 | 11/2012 | Roberts et al. | |
| 2012/0306910 A1 | 12/2012 | Kim et al. | |
| 2013/0114193 A1 * | 5/2013 | Joo et al. | 361/679.01 |

FOREIGN PATENT DOCUMENTS

| | | |
|---|---|---|
| KR | 10-2007-0080763 A | 8/2007 |
| KR | 10-2008-0035709 A | 4/2008 |
| KR | 10-2010-0027501 A | 3/2010 |
| KR | 10-2011-0133861 A | 12/2011 |
| KR | 10-2012-0124217 A | 11/2012 |
| KR | 10-2013-0007312 A | 1/2013 |

* cited by examiner

*Primary Examiner* — Tuan T Dinh
*Assistant Examiner* — Rockshana Chowdhury
(74) *Attorney, Agent, or Firm* — Lee & Morse, P.C.

(57) ABSTRACT

A display apparatus includes a flexible display panel configured to display an image, and a bending control portion including a plurality of blocks on a rear side of the display panel, the plurality of blocks being connected to each other and rotated toward the display panel at a predetermined angle, wherein first side surfaces of the blocks are spaced part from each other at a first distance, first side surfaces of the blocks being adjacent to front surfaces of the blocks facing the display panel, wherein second side surfaces of the blocks are adjacent to each other and substantially parallel to each other, the second side surfaces of the blocks being adjacent to rear surfaces of the blocks opposite the front surfaces of the blocks, and wherein the blocks are rotatable toward the display panel with respect to a border therebetween, such that the first distance decreases.

19 Claims, 18 Drawing Sheets

DISPLAY APPARATUS

CROSS-REFERENCE TO RELATED APPLICATION

Korean Patent Application No. 10-2013-0054477, filed on May 14, 2013, in the Korean Intellectual Property Office, and entitled: "Display Apparatus," is incorporated by reference herein in its entirety.

BACKGROUND

1. Field

The present disclosure relates to a display apparatus. More particularly, the present disclosure relates to a display apparatus capable of precisely controlling a bending angle of a flexible display panel.

2. Description of the Related Art

Electronic devices that provide a user with an image, e.g., a smart phone, a digital camera, a notebook, a navigation system, a smart television set, etc., may include a display device. The display device may include a display panel to generate and display the image.

Various display panels, e.g., a liquid crystal display panel, an organic light emitting display panel, an electrowetting display panel, an electrophoretic display panel, etc., have been developed as the display panel. The display panel may include a substrate and a plurality of pixels formed on the substrate. The pixels receive data signals and display grayscales corresponding to the data signals, thereby displaying a desired image.

In recent years, a flexible display panel has been researched and developed. The flexible display panel includes a substrate formed of a plastic material with flexibility, and thus the flexible display panel has flexibility.

SUMMARY

The present disclosure provides a display apparatus capable of precisely controlling a bending angle of a flexible display panel.

Embodiments of the inventive concept provide a display apparatus including a flexible display panel that displays an image and a bending control portion that includes a plurality of blocks disposed at a rear side of the display panel and connected to each other. Each of the blocks is rotated to the display panel at a predetermined angle. Side surfaces of the blocks, which are adjacent to front surfaces of the blocks facing the display panel, are spaced part from each other at a first distance, side surfaces of the blocks, which are adjacent to rear surfaces of the blocks, are disposed adjacent to each other and substantially in parallel to each other, and the blocks are rotated to the display panel with respect to a border therebetween such that the first distance becomes narrow.

The display panel is extended in a first direction to have long sides in the first direction and short sides in a second direction substantially vertical to the first direction, each of the blocks is extended in the second direction to have long sides in the second direction and short sides in the first direction, and the blocks area arranged in the first direction.

The blocks include a first block connected to a center portion of the display panel, a plurality of second blocks disposed at a first side of the first block and arranged in the first direction, and a plurality of third blocks disposed at a second side of the first block and arranged in the first direction to be symmetrical with the second blocks.

The bending control portion includes a first block driving unit disposed at an upper portion of the rear surface of the first block, a second block driving unit disposed at a lower portion of the rear surface of the first block, a plurality of first pulley units disposed at upper and lower surfaces of the first block and the second blocks, a plurality of second pulley units disposed at upper and lower surfaces of the first block and the third blocks, a plurality of first wire fixing units disposed at the upper and lower surfaces of a last second block, which is positioned at an outermost position in the first side, among the second blocks, a plurality of second wire fixing units disposed at the upper and lower surfaces of a last third block, which is positioned at an outermost position in the second side, among the third blocks, a plurality of first wires disposed at the upper and lower portions of the first block and the second blocks, each connected to a corresponding first wire fixing unit of the first wire fixing units, and connected to a first side of the first and second block driving units via the first pulley unit, and a plurality of second wires disposed at the upper and lower portions of the first block and the third blocks, each connected to a corresponding second wire fixing unit of the second wire fixing units, and connected to a second side of the first and second block driving units via the second pulley unit.

The first pulley units include a plurality of first first pulley units disposed adjacent to a rear surface of the first block and second sub-blocks configured to include the second blocks except for the last second block, and disposed at a first side of upper and lower surfaces of the first block and the second sub-blocks, and a plurality of first second pulley units disposed adjacent to a front surface of the second blocks and disposed at a second side of the upper and lower surfaces of the second blocks. The second pulley units include a plurality of second first pulley units disposed adjacent to a rear surface of the first block and third sub-blocks configured to include the third blocks except for the last third block, and disposed at a second side of upper and lower surfaces of the first block and the third sub-blocks, and a plurality of second second pulley units disposed adjacent to a front surface of the third blocks and disposed at a first side of the upper and lower surfaces of the third blocks A predetermined area of the upper portion of the first block driving unit is disposed at a position higher than an upper boundary surface of the first block, a predetermined area of the lower portion of the second block driving unit is disposed at a position lower than a lower boundary surface of the first block, the first wire fixing units are disposed to the rear surface of the last second block and disposed at the first side of the upper and lower surfaces of the last second block, and the second wire fixing units are disposed to the rear surface of the last third block and disposed at the second side of the upper and lower surfaces of the last third block.

The first block driving unit includes a first motor unit disposed at the first side thereof and a second motor unit disposed at the second side thereof and rotated in an opposite direction to the first motor unit, the second block driving unit includes a third motor unit disposed at the first side thereof and a fourth motor unit disposed at the second side thereof and rotated in an opposite direction to the third motor unit, the first motor unit is rotated in a same direction as the third motor unit, and the second motor unit is rotated in a same direction as the fourth motor unit.

One end of each of the first wires is connected to a second side of a corresponding first wire fixing unit of the first wire fixing units, the other end of each of the first wires is connected to the first and third motor units, the first wires are disposed on side surfaces of the first first pulley units disposed adjacent to the rear surface of the second sub-blocks and side surfaces of the first second pulley units disposed adjacent to the front surface of the second blocks, one end of each of the second wires is connected to the second and fourth motor units, the other end of each of the second wires is connected to a first side of a corresponding second wire fixing unit of the second wire fixing units, and the second wires are disposed on side surfaces of the second first pulley units disposed adjacent to the rear surface of the third sub-blocks and side surfaces of the second second pulley units disposed adjacent to the front surface of the third blocks.

Each of the first and second pulley units has a cylindrical shape, a diameter of an outer circumference surface of a center portion of each of the first and second pulley units is set to be smaller than a diameter of an outer circumference surface of upper and lower sides of each of the first and second pulley units, and the first and second wires are disposed on the outer circumference surface of the center portion of the first and second pulley units.

Each of the second sub-blocks includes a first extension portion having a first width in the third direction and a first length in the first direction, a second extension portion connected to a first side of the first extension portion and having a second length smaller than the first length in the first direction, a first protrusion portion that includes a third extension portion connected to a first side surface of the second extension portion and extended in the third direction and a first convex portion connected to a lower portion of the third extension portion and having a convex arc shape convex to the third direction, and a second protrusion portion that includes a first concave portion connected to a second side of the first extension portion and extended in the first direction to face the first convex portion, the first concave portion have a concave shape concave to the third direction to have a same curvature as the first convex portion. The last second block is configured to include the first extension portion and the second protrusion portion, a first side surface of the second extension portion has a second width smaller than the first width in the third direction, a second side surface of the second extension portion has the first width in the third direction, a front surface of the second extension portion is inclined at a first angle with respect to the first direction, a first side of the third extension portion has a third width smaller than the second width, and a second side of the third extension portion has the second width.

Rear surfaces of the first extension portion, the second extension portion, and the third extension portion are arranged lengthwise horizontally in the first direction, the third extension portion has a third length smaller than the second length in the first direction, a first side of the second protrusion portion is spaced apart from the rear surface of the first extension portion by the third width and connected to a second side of the first extension portion, the first concave portion has a length smaller than a length of the first convex portion when viewed in an upper plan view, the second side surface of the second protrusion portion is spaced apart from the front surface of the second extension portion by the first distance, and a second side surface of the first extension portion is disposed adjacent to and substantially in parallel to the first side surface of the third extension portion in an area corresponding to the third width from the rear surface of the first extension portion.

Each of the third sub-blocks includes a fourth extension portion having a same shape as the first extension portion and being disposed to be symmetrical with the first extension portion, a fifth extension portion having a same shape as the second extension portion and being disposed to be symmetrical with the second extension portion, a third protrusion portion having a same shape as the first protrusion portion and being disposed to be symmetrical with the first protrusion portion, and a fourth protrusion portion having a same shape as the second protrusion portion and being disposed to be symmetrical with the second protrusion portion. The third protrusion portion includes a sixth extension portion having a same shape as the third extension portion and being disposed to be symmetrical with the third protrusion portion and a second convex portion having a same shape as the first convex portion and being disposed to be symmetrical with the first convex portion. The fourth protrusion portion includes a second concave portion having a same shape as the first concave portion and being disposed to be symmetrical with the first concave portion, and the last third block includes the fourth extension portion and the fourth protrusion portion.

Each of the second and third blocks further includes a block connection portion connected to the first concave portion and a second concave portion, the first protrusion portion is connected to upper and lower portions of the first side surface of the second extension portion, a portion of the first protrusion portion connected to the upper portion of the first side surface of the second extension portion is spaced apart from a portion of the first protrusion portion connected to the lower portion of the first side surface of the second extension portion by a second distance in the second direction, the third protrusion portion is connected to upper and lower portions of the first side surface of the fifth extension portion, a portion of the third protrusion portion connected to the upper portion of the first side surface of the fifth extension portion is spaced apart from a portion of the third protrusion portion connected to the lower portion of the first side surface of the fifth extension portion by the second distance in the second direction, and the block connection portion is extended in the second direction to have a length corresponding to the second distance in the second direction.

The display apparatus further includes a pin unit and a pin coupling unit connected to a lower portion of the pin unit and having a cylindrical shape. The first and second blocks include a first hole extended in the second direction and having the cylindrical shape, the block connection portion includes a second hole extended from a center portion of a cross section of the block connection portion to the second direction and overlapped with the first hole, the pin unit is inserted into the first hole and the second hole, the pin coupling unit is connected to a lower portion of the pin unit in the second direction, the second blocks adjacent to each other and the third blocks adjacent to each other are rotated with respect to the pin unit such that the first distance becomes narrow and the second and third blocks are bent to a direction in which the display panel is disposed at a predetermined angle.

The first block includes a first sub-extension portion extended in the first direction, a second sub-extension portion connected to a first side of the first sub-extension portion and having a same shape as the second extension portion, a third sub-extension portion connected to a second side of the first sub-extension portion and configured to be symmetrical with the first sub-extension portion, a first sub-protrusion portion connected to a first side of the second sub-extension portion and having a same shape as the first protrusion portion, and a second sub-protrusion portion connected to a second side of the third sub-extension portion and configured to be symmetrical with the first sub-protrusion portion. The first sub-protrusion portion is connected to the block connection portion of the second block adjacent thereto by the pin unit, the second sub-protrusion portion is connected to the block connection portion of the third block adjacent thereto by the pin unit, and the first and second blocks adjacent to each other and the first and third blocks adjacent to each other are rotated with respect to the pin unit such that the first distance becomes narrow and the first, second, and third blocks are bent to the direction in which the display panel is disposed at the predetermined angle.

Each of the first first pulley units is disposed adjacent to the rear surface of the third extension portion and the rear surface of the first sub-protrusion portion at the first side of the third extension portion and the first side of the first sub-protrusion portion, each of the first second pulley units is disposed adjacent to the front surface of the first extension portion at the second side of the first extension portion, each of the second first pulley units is disposed adjacent to the rear surface of the sixth extension portion and the rear surface of the second sub-protrusion portion at the second side of the sixth extension portion and the second side of the second sub-protrusion portion, and each of the second second pulley units is disposed adjacent to the front surface of the fourth extension portion at the first side of the fourth extension portion.

Embodiments of the inventive concept provide a display apparatus includes a flexible display panel that displays an image, a first bimetal unit disposed at a rear side of the flexible display panel and having a first expansion rate, a second bimetal unit disposed at a rear side of the first bimetal unit and having a second expansion rate greater than the first expansion rate, a bending control portion disposed at a rear side of the second bimetal unit and including a plurality of blocks connected to the second bimetal unit, and a connection portion that connects a center portion of the flexible display panel and a center portion of the first bimetal unit. Side surfaces of the blocks, which are adjacent to front surfaces of the blocks facing the second bimetal unit, are spaced part from each other at a first distance, side surfaces of the blocks, which are adjacent to rear surfaces of the blocks, are disposed adjacent to each other and substantially in parallel to each other, and the blocks are rotated to the display panel with respect to a border therebetween such that the first distance becomes narrow.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
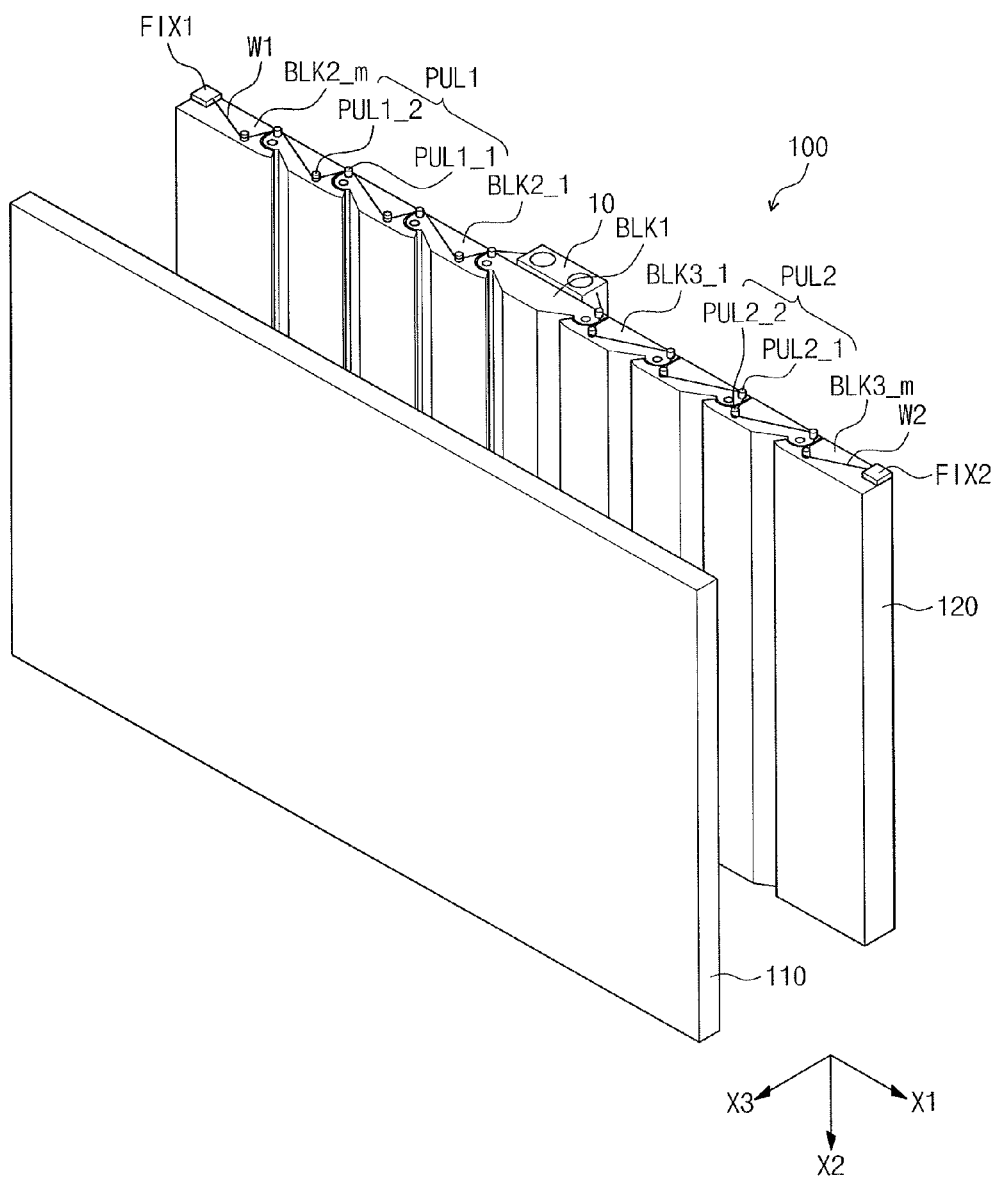
FIG. 1 illustrates a perspective view of a display apparatus according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, embodiments will be explained in detail with reference to the accompanying drawings.

Figure 2:
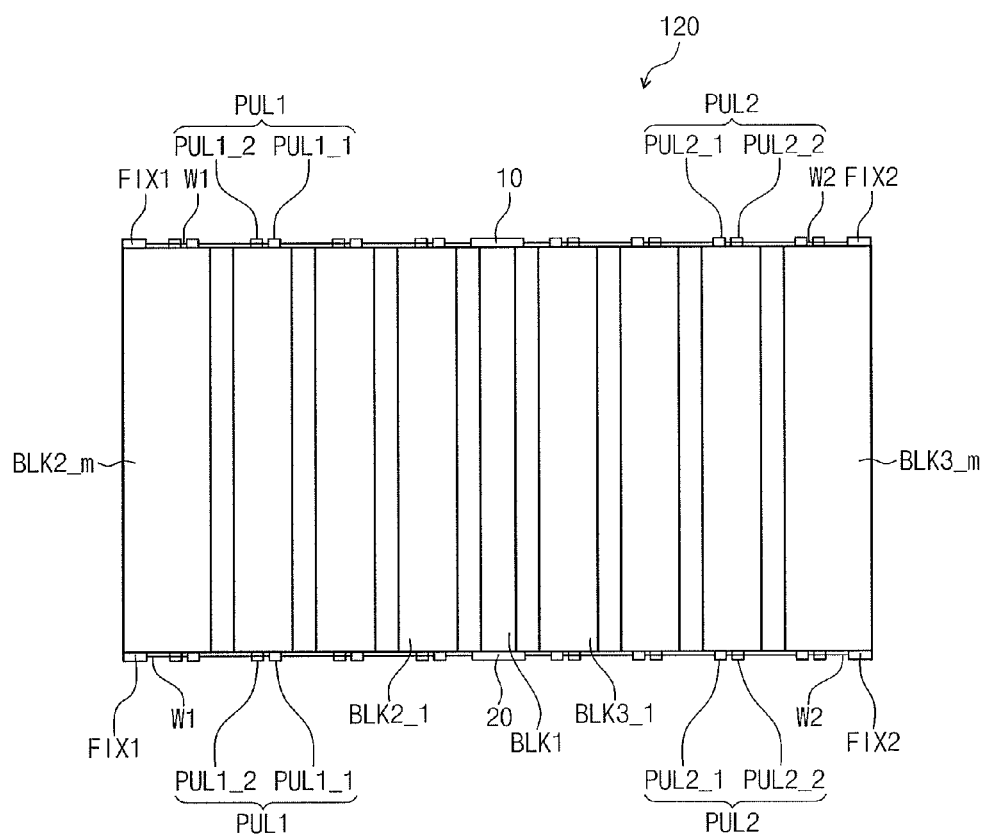
FIG. 2 illustrates a front view of a bending control portion shown in FIG. 1.

FIG. 1 illustrates a perspective view of a display apparatus according to an exemplary embodiment. FIG. 2 illustrates a front view of a bending control portion shown in FIG. 1.

Referring to FIGS. 1 and 2, a display apparatus 100 may include a display panel 110 that displays an image and a bending control portion 120 disposed at a rear side of the display panel 110. Hereinafter, a surface of the bending control portion 120, which faces the display panel 110, is referred to as a front surface, and a surface of the bending control portion 120, which is opposite to the front surface, is referred to as a rear surface.

The display panel 110 may be a flexible display panel. For instance, the display panel 110 may be manufactured by using a substrate formed of a plastic material with flexibility, and thus the display panel 110 has flexibility.

When viewed in a plan view, the bending control portion 120 has the same shape and area as those of the display panel 110. As an example, each of the display panel 110 and the bending control portion 120 has long sides in a first direction X1 and short sides in a second direction X2 substantially vertical to the first direction X1. The bending control portion 120 is disposed to overlap with the display panel 110. Hereinafter, a direction substantially vertical to the first and second directions X1 and X2 will be referred to as a third direction X3.

Referring to FIG. 2, the bending control portion 120 may include a plurality of blocks BLK1, BLK2_1 to BLK2_m, and BLK3_1 to BLK3_m, a plurality of block driving units 10 and 20, a plurality of wire fixing units FIX 1 and FIX2, a plurality of pulley units PUL1 and PUL2, and a plurality of wires W1 and W2.

The blocks BLK1, BLK2_1 to BLK2_m, and BLK3_1 to BLK3_m are extended in the second direction X2 and have a short side in the first direction X1 and a long side in the second direction X2. The blocks BLK1, BLK2_1 to BLK2_m, and BLK3_1 to BLK3_m are arranged in the first direction X1, and adjacent blocks in the first direction X1 among the blocks BLK1, BLK2_1 to BLK2_m, and BLK3_1 to BLK3_m are connected to each other.

The blocks BLK1, BLK2_1 to BLK2_m, and BLK3_1 to BLK3_m include a first block BLK1, a plurality of second blocks BLK2_1 to BLK2_m, and a plurality of third blocks BLK3_1 to BLK3_m. In this case, "m" is an integer number equal to or greater than 1. FIG. 1 shows four second blocks BLK2_1 to BLK2_m and four third blocks BLK3_1 to BLK3_m, but the number of the second blocks BLK2_1 to BLK2_m and the third blocks BLK3_1 to BLK3_m is not be limited thereto.

In addition, the number of the second blocks BLK2_1 to BLK2_m is set to be equal to the number of the third blocks BLK3_1 to BLK3_m, but it is not limited thereto. That is, the number of the second blocks BLK2_1 to BLK2_m may be set to be different from the number of the third blocks BLK3_1 to BLK3_m.

Hereinafter, when viewed in a front view, a left side of each element will be referred to as a first side and a right side of each element will be referred to as a second side.

The first block BLK1 is placed at a position corresponding to a center of the display panel 110. The second blocks BLK2_1 to BLK2_m are arranged on the first, i.e., left, side, of the first block BLK1, along the first direction X1 and connected to each other.

The third blocks BLK3_1 to BLK3_m are arranged on the second, i.e., right, side of the first block BLK1 along the first direction X1 and connected to each other. The third blocks BLK3_1 to BLK3_m are symmetrical with the second blocks BLK2_1 to BLK2_m with respect to the first block BLK1.

Hereinafter, the second blocks BLK2_1 to BLK2_m are respectively referred to as a second first block BLK2_1 to a second m-th block BLK2_m in order of positions relative to the first block BLK1, i.e., the second first block BLK2_1 is closer than the second second block BLK2_2 to the first block BLK1. In addition, the third blocks BLK3_1 to BLK3_m are respectively referred to as a third first block BLK3_1 to a third m-th block BLK3_m in order of positions thereof closer to the first block BLK1.

The block driving units 10 and 20 include a first block driving unit 10 disposed at an upper portion of the rear side of the first block BLK1 and a second block driving unit 20 disposed at a lower portion of the rear side of the first block BLK1.

The wire fixing units FIX1 and FIX2 include two first wire fixing units FIX1 and two second wire fixing units FIX2. The first wire fixing units FIX1 are respectively disposed on upper and lower surfaces of the first side of the second m-th block BLK2_m among the second blocks BLK2_1 to BLK2_m, which is farthest apart from the first block BLK1. The second wire fixing units FIX2 are respectively disposed on upper and lower surfaces of the second side of the third m-th block BLK3_m among the third blocks BLK3_1 to BLK3_m, which is farthest apart from the first block BLK1.

The pulley units PUL1 and PUL2 include a plurality of first pulley units PUL1 and a plurality of second pulley units PUL2. The first pulley units PUL1 are disposed on upper and lower surfaces of the first block BLK1 and the second blocks BLK2_1 to BLK2_m . The second pulley units PUL2 are disposed on upper and lower surfaces of the first block BLK1 and the third blocks BLK3_1 to BLK3_m.

The wires W1 and W2 include two first wires W1 and two second wires W2. The first wires W1 are disposed on upper and lower portions of the second blocks BLK2_1 to BLK2_m and the second wires W2 are disposed on upper and lower portions of the third blocks BLK3_1 to BLK3_m. The first wires W1 are connected to the first wire fixing units FIX1 and connected to the first side of the first block driving unit 10 and the first side of the second block driving unit 20 via the first pulley units PUL1. The second wires W2 are connected to the second wire fixing units FIX2 and connected to the second side of the first block driving unit 10 and the second side of the second block driving unit 20 via the second pulley units PUL2.

The connections between the first and second block driving units 10 and 20, the first and second wire fixing units FIX1 and FIX2, the first and second pulley units PUL1 and PUL2, and the first and second wires W1 and W2 will be described in detail with reference to FIGS. 4 to 6.

Figure 3:
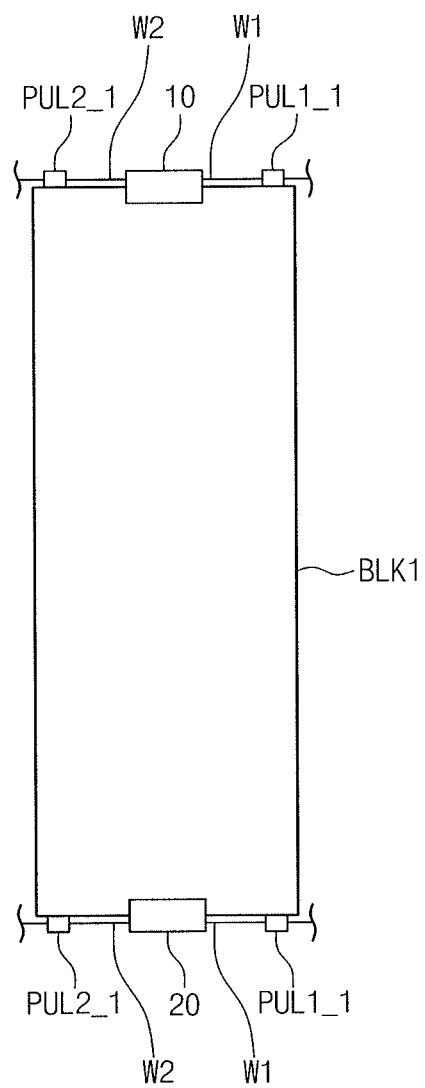
FIG. 3 illustrates a rear view of a first block shown in FIG. 2.

FIG. 3 illustrates a rear view showing a first block shown in FIG. 2.

Referring to FIG. 3, a predetermined area of the lower portion of the first block driving unit 10 is connected to the upper portion of the rear side of the first block BLK1, and a predetermined area of the upper portion of the first block driving unit 10 is disposed at a position higher than an upper boundary surface of the first block BLK1. A predetermined area of the upper portion of the second block driving unit 20 is connected to the lower portion of the rear side of the first block BLK1, and a predetermined area of the lower portion of the second block driving unit 20 is disposed at a position lower than a lower boundary surface of the first block BLK1.

The first wires W1 are connected to the first fixing units FIX1 and connected to the upper portion of the first side of the first block driving unit 10 and the lower portion of the first side of the second block driving unit 20 via the first pulley unit PUL1. The second wires W2 are connected to the second fixing units FIX2 and connected to the upper portion of the second side of the first block driving unit 10 and the lower portion of the second side of the second block driving unit 20 via the second pulley unit PUL2.

Figure 4:
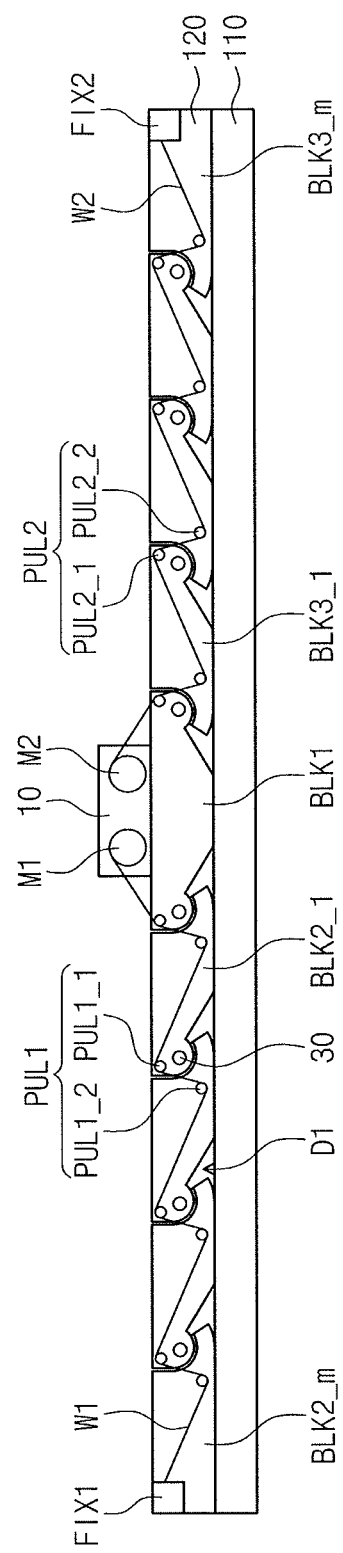
FIG. 4 illustrates a top view of the bending control portion shown in FIG. 1.
Figure 5:
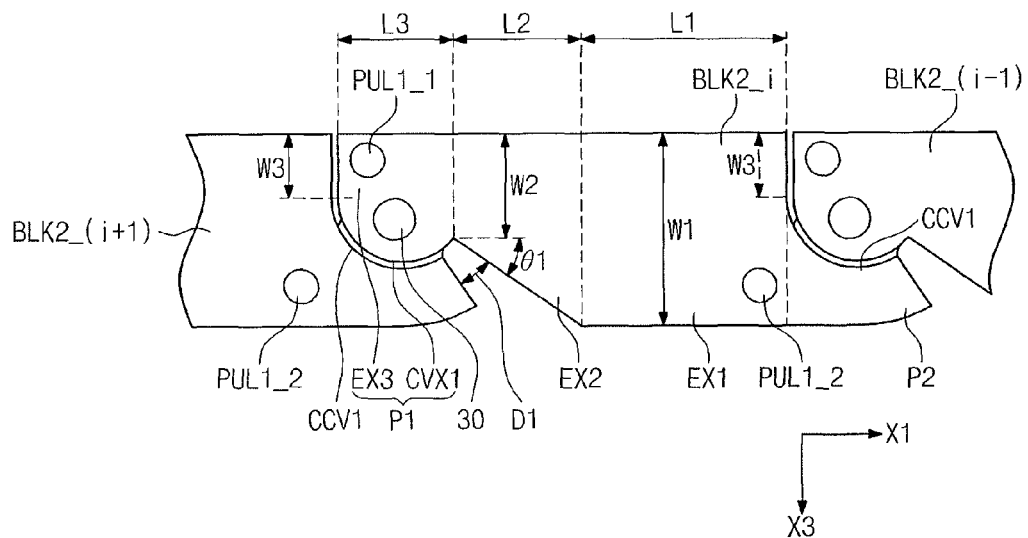
FIG. 5 illustrates a partially enlarged view of second blocks adjacent to each other shown in FIG. 4.
Figure 6:
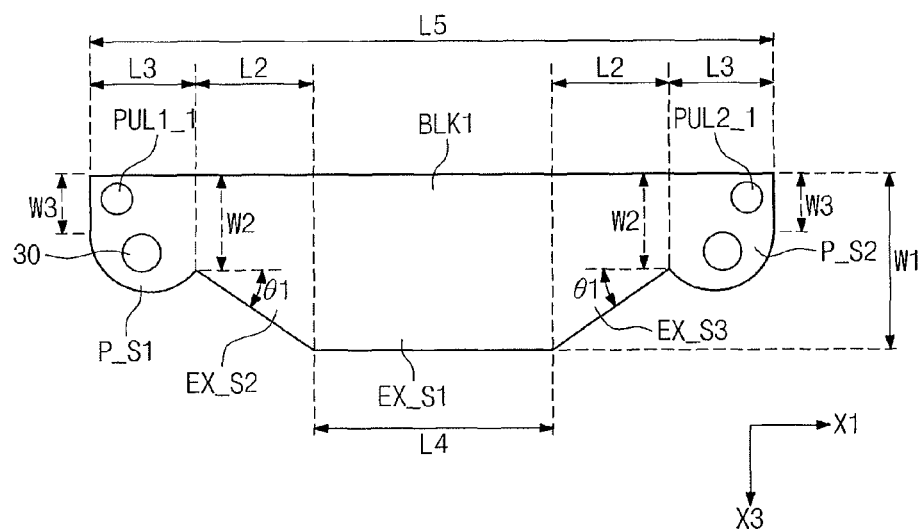
FIG. 6 illustrates a partially enlarged view of the first block shown in FIG. 4.

FIG. 4 illustrates a top view showing the bending control portion 120 of FIG. 1, FIG. 5 illustrates a partially enlarged view of adjacent second blocks BLK2 of FIG. 4, and FIG. 6 illustrates a partially enlarged view of the first block BLK1 shown in FIG. 4.

The connections between the first block driving unit 10, the first and second wire fixing units FIX1 and FIX2, the first and second pulley units PUL1 and PUL2, and the first and second wires W1 and W2, which are disposed on the upper portion of the first to third blocks BLK1, BLK2_1 to BLK2_m, and BLK3_1 to BLK3_m, are the same as the connections between the second block driving unit 20, the first and second wire fixing units FIX1 and FIX2, the first and second pulley units PUL1 and PUL2, and the first and second wires W1 and W2, which are disposed on the lower portion of the first to third blocks BLK1, BLK2_1 to BLK2_m, and BLK3_1 to BLK3_m.

Therefore, the connections between the first block driving unit 10, the first and second wire fixing units FIX1 and FIX2, the first and second pulley units PUL1 and PUL2, and the first and second wires W1 and W2, which are disposed on the upper portion of the first to third blocks BLK1, BLK2_1 to BLK2_m, and BLK3_1 to BLK3_m, will be described in detail with reference to FIG. 4. In addition, the connections between the second block driving unit 20, the first and second wire fixing units FIX1 and FIX2, the first and second pulley units PUL1 and PUL2, and the first and second wires W1 and W2, which are disposed on the lower portion of the first to third blocks BLK1, BLK2_1 to BLK2_m, and BLK3_1 to BLK3_m, will be described without referring to figures.

Referring to FIG. 4, a center of the display panel 110 is connected to the first block BLK1. In detail, a rear surface of the center of the display panel 110 is connected to a front surface of the first block BLK1.

Side surfaces of the first to third blocks BLK1, BLK2_1 to BLK2_m, and BLK3_1 to BLK3_m, which are adjacent to front surfaces of the first to third blocks BLK1, BLK2_1 to BLK2_m, and BLK3_1 to BLK3_m, are disposed to be spaced apart from each other by a first distance D1. Side surfaces of the first to third blocks BLK1, BLK2_1 to BLK2_m, and BLK3_1 to BLK3_m, which are adjacent to rear surfaces of the first to third blocks BLK1, BLK2_1 to BLK2_m, and BLK3_1 to BLK3_m, are disposed to be adjacent to each other and substantially in parallel to each other.

The first to third blocks BLK1, BLK2_1 to BLK2_m, and BLK3_1 to BLK3_m are rotated toward the display panel 110 with respect to a border between the first to third blocks BLK1, BLK2_1 to BLK2_m, and BLK3_1 to BLK3_m such that the first distance D1 becomes narrow.

The second blocks BLK2_1 to BLK2_m, the third blocks BLK3_1 to BLK3_m, the first block BLK1 and the second first block BLK2_1, and the first block BLK1 and the third first block BLK3_1 are connected to each other by pin units 30. This will be described in detail with reference to FIG. 7.

The first block driving unit 10 includes a first motor unit M1 disposed at the first side of the first block driving unit 10 and a second motor unit M2 disposed at the second side of the first block driving unit 10 and rotated in an opposite direction to that of the first motor unit M1. Although not shown in figures, the second block driving unit 20 includes a third motor unit disposed at the first side of the second block driving unit 20 and a fourth motor unit disposed at the second side of the second block driving unit 20 and rotated in an opposite direction to that of the third motor unit. The first motor unit M1 and the third motor unit are rotated in the same direction, and the second motor unit M2 and the fourth motor unit are rotated in the same direction.

The first pulley units PUL1 include a plurality of first first pulley units PUL1_1 and a plurality of first second pulley units PUL1_2. Among the second blocks BLK2_1 to BLK2_m, the second first block BLK2_1 to a second (m−1)th block BLK2_(m−1), i.e., except for the second m-th block BLK2_m, are referred to as second sub-blocks BLK2_1 to BLK2_(m−1).

The first first pulley units PUL1_1 are disposed at the first side of the upper and lower surfaces of the first block BLK1 and the second sub-blocks BLK2_1 to BLK2_(m−1) to be adjacent to the rear surface of the first block BLK1 and the second sub-blocks BLK2_1 to BLK2_(m−1). The first second pulley units PUL1_2 are disposed at the second side of the upper and lower surfaces of the second blocks BLK2_1 to BLK2_m to be adjacent to the front surface of the second blocks BLK2_1 to BLK2_m.

The first first pulley units PUL1_1 and the first second pulley units PUL1_2 are arranged not to be overlapped with each other in the third direction X3. Among the first first pulley units PUL1_1 and the first second pulley units PUL1_2, which are disposed adjacent to each other in the first direction X1, the first first pulley unit PUL1_1 is positioned at a right side and the first second pulley units PUL1_2 is positioned at a left side.

The second pulley units PUL2 include a plurality of second first pulley units PUL2_1 and a plurality of second second pulley units PUL2_2. Among the third blocks BLK3_1 to BLK3_m, the third first block BLK3_1 to a third (m−1)th block BLK3_(m−1), i.e., except for the third m-th block BLK3_m, are referred to as third sub-blocks BLK3_1 to BLK3_(m−1).

The second first pulley units PUL2_1 are disposed at the second side of the upper and lower surfaces of the first block BLK1 and the third sub-blocks BLK3_1 to BLK3_(m−1) to be adjacent to the rear surface of the first block BLK1 and the third sub-blocks BLK3_1 to BLK3_(m−1). The second second pulley units PUL2_2 are disposed at the first side of the upper and lower surfaces of the third blocks BLK3_1 to BLK3_m to be adjacent to the front surface of the third blocks BLK3_1 to BLK3_m.

The second first pulley units PUL2_1 and the second second pulley units PUL2_2 are arranged not to be overlapped with each other in the third direction X3. Among the second first pulley units PUL2_1 and the second second pulley units PUL2_2, which are disposed adjacent to each other in the first direction X1, the second first pulley unit PUL1_1 is positioned at the left side and the second second pulley units PUL2_2 is positioned at the right side.

The first wire fixing units FIX1 are disposed at the first side of the upper and lower surfaces of the second m-th block BLK2_m to be adjacent to the rear surface of the second m-th block BLK2_m . The second wire fixing units FIX2 are disposed at the second side of the upper and lower surfaces of the third m-th block BLK3_m to be adjacent to the rear surface of the third m-th block BLK3_m.

First ends of the first wires W1 are connected to the second sides of the first wire fixing units FIX1, respectively, and second ends of the first wires W1 are connected to the first motor unit M1 of the first block driving unit 10 and the third motor unit of the second block driving unit 20. The first motor unit M1 and the third motor unit are rotated in a clockwise or counter-clockwise direction to move the first wires W1.

The first wires W1 are disposed on the side surfaces of the first first pulley units PUL1_1 adjacent to the rear surfaces of the second sub-blocks BLK2_1 to BLK2_(m−1). In addition, the first wires W1 are disposed on the side surfaces of the first second pulley units PUL1_2 adjacent to the front surfaces of the second blocks BLK2_1 to BLK2_m.

The first first pulley units PUL1_1 and the first second pulley units PUL1_2 may be rotated. Thus, the first wires W1 move by the rotation of the first first pulley units PUL1_1 and the first second pulley units PUL1_2.

First ends of the second wires W2 are connected to the second motor unit M2 of the first block driving unit 10 and the fourth motor unit of the second block driving unit 20. Second ends of the second wires W2 are connected to the first sides of the second wire fixing units FIX2. The second motor unit M2 and the fourth motor unit are rotated in the clockwise or counter-clockwise direction to move the second wires W2.

The second wires W2 are disposed on the side surfaces of the second first pulley units PUL2_1 adjacent to the rear surfaces of the third sub-blocks BLK3_1 to BLK3_(m−1). In addition, the second wires W2 are disposed on the side surfaces of the second second pulley units PUL2_2 adjacent to the front surfaces of the third blocks BLK3_1 to BLK3_m.

The second first pulley units PUL2_1 and the second second pulley units PUL2_2 may be rotated. Thus, the second wires W2 move by the rotation of the second first pulley units PUL2_1 and the second second pulley units PUL2_2.

Referring to FIG. 5, the second sub-block BLK2_i includes a first extension portion EX1, a second extension portion EX2 connected to a first side of the first extension portion EX1, a first protrusion portion P1 connected to a first side of the second extension portion EX2, and a second protrusion portion P2 connected to a second side of the first extension portion EX1.

Each second sub-block, which is not shown in figures, has the same structure as the second sub-block BLK2_i. For the convenience of explanation, only three second sub-blocks BLK2_(i−1), BLK2_i, and BLK2_(i+1) are shown in FIG. 5. In this case, "i" is an integer number greater than zero (0) and smaller than "m".

The first extension portion EX1 has a rectangular shape defined by long sides in the first direction X1 and short sides in the third direction X3. The first extension portion EX1 has a first length L1 in the first direction X1 and a first width W1 in the third direction X3.

The second extension portion EX2 has a second length L2 smaller than the first length L1 in the first direction X1. The first side surface of the second extension portion EX2 has a second width W2 smaller than the first width W1 in the third direction X3. The second side surface of the second extension portion EX2 has the first width W1 in the third direction X3. The second side of the second extension portion EX2 is connected to the first side of the first extension portion EX1. A front surface of the second extension portion EX2 may be an inclined surface inclined at a first angle θ1 with respect to the first direction X1.

The first protrusion portion P1 includes a third extension portion EX3 extended in the third direction X3 and a first convex portion CVX1 connected to a lower portion of the third extension portion EX3 in the third direction X3 and having a circular arc shape. A first side of the third extension portion EX3 has a third width W3 smaller than the second width W2 in the third direction X3 and a second side of the third extension portion EX3 has the second width W2 in the third width direction X3. The third extension portion EX3 has a third length L3 smaller than the second length L2 in the first direction X1. A rear surface of the first extension portion EX1, a rear surface of the second extension portion EX2, and a rear surface of the third extension portion EX3 are arranged lengthwise horizontally in the first direction X1.

A first side of the second protrusion portion P2 is spaced apart from the rear surface of the first extension portion EX1 by the third width W3 and connected to the second side of the first extension portion EX1. The second protrusion portion P2 is extended in the first direction X1 and includes a first concave portion CCV1 facing the first convex portion CVX1 and having a concave shape in the third direction X3 to have the same curvature as that of the first convex portion CVX1.

When viewed in a plan view, a length of the first concave portion CCV1 is shorter than a length of the first convex portion CVX1. The second side of the second protrusion portion P2 is disposed to be spaced apart from the inclined surface of the second extension portion EX2 by the first distance D1.

The second side surface of the first extension portion EX1 is disposed adjacent to the first side surface of the third extension portion EX3 of the first protrusion portion P1 in the area corresponding to the third width W3 from the rear surface of the first extension portion EX1 to the third direction X3.

The first first pulley unit PUL1_1 is disposed adjacent to the rear surface of the third extension portion EX3 at the first side of the third extension portion EX3 of the first protrusion portion P1. The first second pulley unit PUL1_2 is disposed adjacent to the front surface of the first extension portion EX1 at the second side of the first extension portion EX1.

As shown in FIG. 4, the second m-th block BLK2_m includes the first extension portion EX1 and the second protrusion portion P2.

The third blocks BLK3_1 to BLK3_m have the same structure and function as those of the second blocks BLK2_1 to BLK2_m, but are arranged in an opposite direction to that of the second blocks BLK2_1 to BLK2_m. That is, the second blocks BLK2_1 to BLK2_m have the same shape as the third blocks BLK3_1 to BLK3_m and are configured to be symmetrical with the third blocks BLK3_1 to BLK3_m with respect to the first block BLK1. For instance, each of the third blocks BLK3_1 to BLK3_m includes a fourth extension portion, a fifth extension portion, a third protrusion portion, and a fourth protrusion portion.

The fourth extension portion has the same shape as that of the first extension portion EX1 and is arranged to be symmetrical with the first extension portion EX1 with respect to the first block BLK1. The fifth extension portion has the same shape as that of the second extension portion EX2 and is arranged to be symmetrical with the second extension portion EX2 with respect to the first block BLK1.

The third protrusion portion has the same shape as that of the first protrusion portion P1 and is arranged to be symmetrical with the first protrusion P1. The fourth protrusion portion has the same shape as that of the second protrusion portion P2 and is arranged to be symmetrical with the second protrusion P2.

The third protrusion portion includes a sixth extension portion having the same shape as the third extension portion EX3 and being arranged to be symmetrical with the third extension portion EX3 and a second convex portion having the same shape as the first convex portion CVX1 and being arranged to be symmetrical with the first convex portion CVX1. The fourth protrusion portion includes a second concave portion having the same shape as the first concave portion CCV1 and being arranged to be symmetrical with the first concave portion CCV1.

As shown in FIG. 4, the third m-th block BLK3_m includes the fourth extension portion and the fourth protrusion portion to be symmetrical with the second m-th block BLK2_m.

Although not shown in the figures, the second first pulley unit PUL2_1 is disposed adjacent to the rear surface of the sixth extension portion at the second side of the sixth extension portion of the third protrusion portion. The second second pulley unit PUL2_2 is disposed adjacent to the front surface of the fourth extension portion at the first side of the fourth extension portion.

Referring to FIG. 6, a fourth length L4, which indicates a front surface length of the first block BLK1 in the first direction X1, is shorter than a fifth length L5, which indicates a rear surface length of the first block BLK1 in the first direction X1.

The structure in the first side of the first block BLK1 is symmetrical with the structure in the second side of the first block BLK1. In detail, the first block BLK1 includes a first sub-extension portion EX_S1, a second sub-extension portion EX_S2 connected to a first side of the first sub-extension portion EX_S1, a third sub-extension portion EX_S3 connected to a second side of the first sub-extension portion EX_S1, a first sub-protrusion portion P_S1 connected to a first side of the second sub-extension portion EX_S2, and a second sub-protrusion portion P_S2 connected to a second side of the third sub-extension portion EX_P3.

The first sub-extension portion EX_S1 is extended in the first direction X1 and has a rectangular shape. The first sub-extension portion EX_S1 has long sides in the first direction X1 and short sides in the third direction X3. The first sub-extension portion EX_S1 has the first width W1 in the third direction X3.

The second sub-extension portion EX_S2 and the first sub-protrusion portion P_S1 have the same configurations as those of the second extension portion EX2 and the first protrusion portion P1.

The third sub-extension portion EX_S3 and the second sub-protrusion portion P_S2 are configured to be symmetrical with the second sub-extension portion EX_S2 and the first sub-protrusion portion P_S1. That is, the third sub-extension portion EX_S3 and the second sub-protrusion portion P_S2 have the same shapes as those of the second sub-extension portion EX_S2 and the first sub-protrusion portion P_S1 and are arranged in an opposite direction of the second sub-extension portion EX_S2 and the first sub-protrusion portion P_S1. Accordingly, detailed descriptions of the first, second, and third sub-extension portions EX_S1, EX_S2, and EX_S3 and the first and second sub-protrusion portions P_S1 and P_S2 will be omitted.

One first first pulley unit PUL1_1 is disposed adjacent to a rear surface of the first sub-protrusion portion P_S1 at a first side of the first sub-protrusion portion P_S1, and one second first pulley unit PUL2_1 is disposed adjacent to a rear surface of the second sub-protrusion portion P_S2 at a second side of the second sub-protrusion portion P_S2.

Referring to FIGS. 4 to 6 again, each first first pulley unit PUL1_1 is disposed adjacent to the rear surface of the third extension portion EX3 and the rear surface of the first sub-protrusion portion P_S1 at the first side of the third extension portion EX3 and the first side of the first sub-protrusion portion P_S1. Each second first pulley unit PUL2_1 is disposed adjacent to the rear surface of the sixth extension portion and the rear surface of the second sub-protrusion portion P_S2 at the second side of the sixth extension portion and the second side of the second sub-protrusion portion P_S2.

Figure 7:
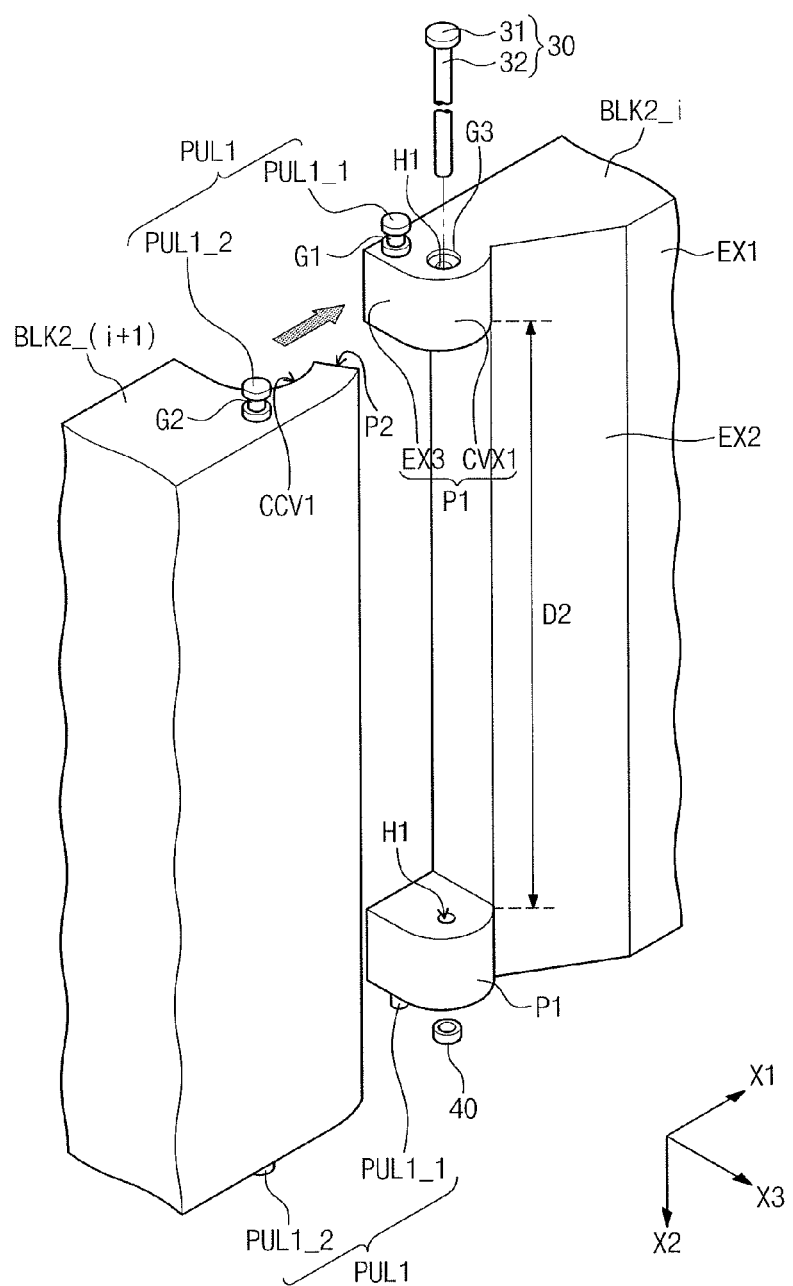
FIG. 7 illustrates an exploded perspective view of the second blocks adjacent to each other shown in FIG. 4.
Figure 8:
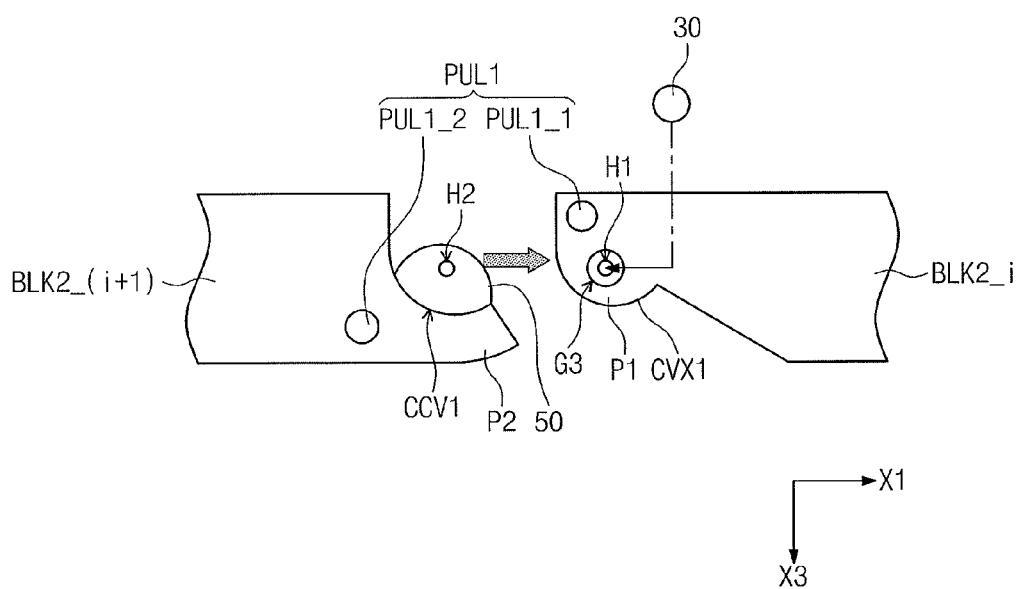
FIG. 8 illustrates a top plan view of the second blocks adjacent to each other shown in FIG. 7.
Figure 9:
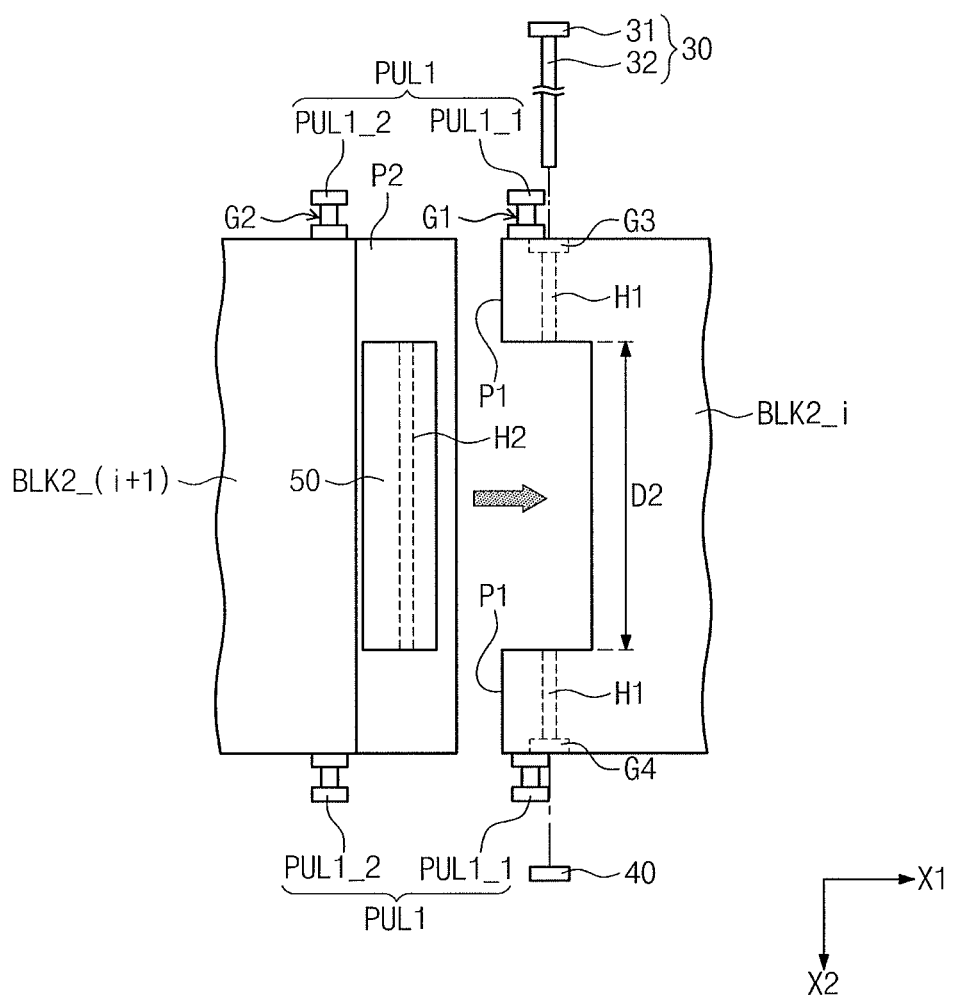
FIG. 9 illustrates a rear view of the second blocks adjacent to each other shown in FIG. 7.

FIG. 7 illustrates an exploded perspective view showing the second blocks adjacent to each other shown in FIG. 4, FIG. 8 is a top plan view showing the second blocks adjacent to each other shown in FIG. 7, and FIG. 9 is a rear view showing the second blocks adjacent to each other shown in FIG. 7.

FIGS. 7 to 9 show the connection between the second blocks adjacent to each other. Although not shown in the figures, the connections between the third blocks, between the first and second blocks, and between the first and third blocks are the same as the second blocks.

Referring to FIGS. 7 to 9, the first first pulley unit PUL1_1 and the first second pulley unit PUL1_2 have the same shape. For instance, the first first pulley unit PUL1_1 and the first second pulley unit PUL1_2 may have a cylindrical shape.

A diameter of an outer circumference surface at upper and lower portions of the first first pulley unit PUL1_1 and the first second pulley unit PUL1_2 is greater than a diameter of the outer circumference surface at a center portion of the first first pulley unit PUL1_1 and the first second pulley unit PUL1_2. As shown in FIG. 7, the outer circumference surface of the cylindrical shape at the center portion of the first first pulley unit PUL1_1 is referred to as a first groove G1 and the outer circumference surface of the cylindrical shape at the center portion of the first second pulley unit PUL1_2 is referred to as a second groove G2. Although not shown in the figures, the second first pulley unit PUL2_1 and the second second pulley unit PUL2_2 have the same shapes as those of the first first pulley unit PUL1_1 and the first second pulley unit PUL1_2 and include first and second grooves G1 and G2, respectively.

As shown in FIG. 7, the first protrusion portion P1 is connected to upper and lower portions of the first side surface of the second extension portion EX2 of the second i-th block BLK2_i, and the first protrusion portion P1 connected to the upper portion of the first side surface of the second extension portion EX2 of the second i-th block BLK2_i is spaced apart from the first protrusion portion P1 connected to the lower portion of the first side surface of the second extension portion EX2 of the second i-th block BLK2_i in the second direction X2 by a second distance D2.

Although not shown in the figures, the third protrusion portion is connected to upper and lower portions of the first side surface of the fourth extension portion, and the third protrusion portion connected to the upper portion of the first side surface of the fourth extension portion is spaced apart from the third protrusion portion connected to the lower portion of the first side surface of the fourth extension portion in the second direction X2 by the second distance D2. In addition, the first and second sub-protrusion portions P_S1 and P_S2 of the first block BLK1 are connected to upper and lower portions of the first side of the second and third sub-extension portions EX_S2 and EX_S3 in the same way.

The first convex portion CVX1 of the first protrusion portion P1 connected to the upper portion of the first side surface of the second extension portion EX2 includes a third groove G3 recessed downward from an upper surface thereof. The first convex portion CVX1 of the first protrusion portion P1 connected to the lower portion of the first side surface of the second extension portion EX2 includes a fourth groove G4 recessed upward from a lower surface thereof. Although not shown in the figures, the third protrusion portion and the first sub-protrusion portion P_S1 include the third and fourth grooves G3 and G4.

The first convex portion CVX1 includes a first hole H1 formed therethrough and extended in the second direction X2. The second convex portion includes the first hole H1 extended in the second direction X2. In addition, the first and second sub-protrusion portions P_S1 and P_S2 include the first hole H1. The first hole H1 is connected to a center of the third groove G3 and a center of the fourth groove G4 and has a cylindrical shape.

The second (i+1)th block BLK2_(i+1) includes a block connection portion 50 (FIGS. 8-9) connected to the first concave portion CCV1 of the second protrusion portion P2. That is, each of the second blocks BLK2_1 to BLK2_m includes the block connection portion 50 connected to the first concave portion CCV1. Although not shown in the figures, each of the third blocks BLK3_1 to BLK3_m includes a block connection portion connected to the second concave portion.

The block connection portion 50 has a curved surface in a cross section. The block connection portion 50 is extended in the second direction X2. The block connection portion 50 has a length corresponding to the second distance D2 in the second direction X2. A second hole H2 is formed through a center in the cross section of the block connection portion 50 and extended in the second direction X2. The second hole H2 may have a cylindrical shape to correspond to the first hole H1.

The block connection portion 50 is disposed between the first protrusion portions P1. The first hole H1 of the first protrusion portion P1 is overlapped with the second hole H2 of the block connection portion 50.

The pin unit 30 includes a head portion 31 and an insertion portion 32 connected to the head portion 31 and extended in the second direction X2. The head portion 31 has a size greater than that of the insertion portion 32 when viewed in a plan view. The insertion portion 32 has a cylindrical shape and the head portion 31 has a shape and size corresponding to the third groove G3.

The pin unit 30 is inserted into the first hole H1 and the second hole H2 to connect the second blocks BLK2_i and BLK2_(i+1) adjacent to each other. In detail, the insertion portion 32 of the pin unit 30 is inserted into the first hole H1 and the second hole H2. The head portion 31 of the pin unit 30 is inserted into the third groove G3. A pin coupling unit 40 is connected to a lower end of the insertion portion 32. The pin coupling unit 40 is inserted into the fourth groove G4.

Although not shown in the figures, the pin unit 30 is inserted into the first hole H1 and the second hole H2 to connect the third blocks adjacent to each other. In addition, the pin unit 30 is inserted into the first hole H1 and the second hole H2 to connect the first sub-protrusion portion P-S1 to the block connection portion 50 of the second first block BLK2_1 adjacent to the first sub-protrusion portion P_S1 and to connect the second sub-protrusion portion P-S2 to the block connection portion 50 of the third first block BLK3_1 adjacent to the second sub-protrusion portion P_S2.

The first hole H1, the second hole H2, and the insertion portion 32 of the pin unit 30 may have a cylindrical shape. Therefore, the second blocks BLK2_1 to BLK2_m adjacent to each other and the third blocks BLK3_1 to BLK3_m adjacent to each other may be rotated at a predetermined angle with respect the pin unit 30. In addition, the first block BLK1 and the second first block BLK2_1 adjacent to the first block BLK1 and the first block BLK1 and the third first block BLK3_1 adjacent to the first block BLK1 may be rotated at a predetermined angle with respect to the pin unit 30.

Figure 10:
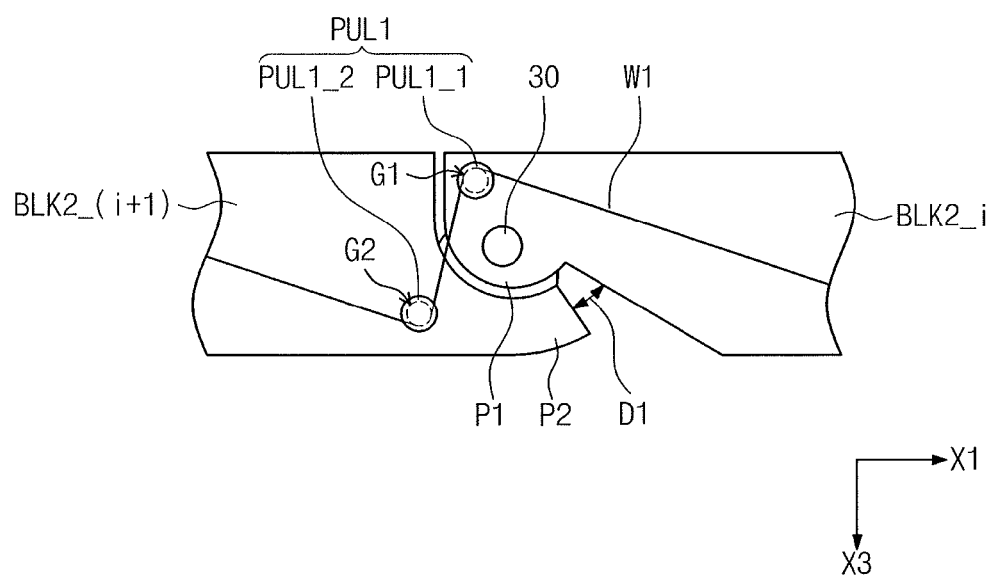
FIG. 10 illustrates a view of first and second pulleys shown in FIG. 7 and a first wire unit connected to the first and second pulleys.

FIG. 10 illustrates a view of the first and second pulleys in FIG. 7 and the first wire unit connected to the first and second pulleys.

Referring to FIG. 10, the first wire W1 is disposed at a side surface of the first groove G1 of the first first pulley units PUL1_1 adjacent to the rear surface of the second i-th block BLK2_i. In addition, the first wire W1 is disposed at a side surface of the second groove G2 of the first second pulley units PUL1_2 adjacent to the front surface of the second (i+1)th block BLK2

Although not shown in the figures, the second wire W2 is disposed at a side surface of the first groove of the second first pulley unit PUL2_1 adjacent to the rear surface of the third sub-blocks BLK3_1 to BLK3_(m−1). In addition, the second wire W2 is disposed at a side surface of the second groove of the second second pulley units PUL2_2 adjacent to the front surface of the third blocks BLK3_1 to BLK3_m.

FIGS. 11A to 11E illustrate views of stages in an operation of the bending control portion 120.

Figure 11A:
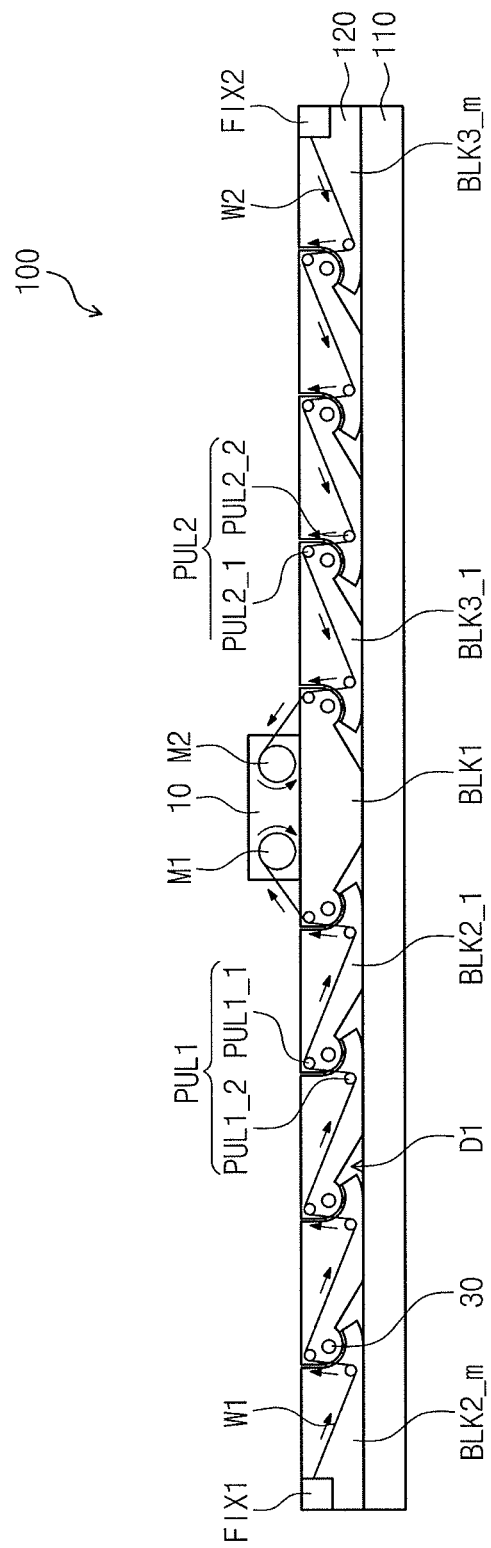
FIGS. 11A to 11E illustrate views of stages in an operation of the bending control portion shown in FIG. 1.

Referring to FIG. 11A, the first motor unit M1 is rotated in the clockwise direction and the second motor unit M2 is rotated in the counter-clockwise direction. Although not shown in the figures, the third motor unit is rotated in the clockwise direction and the fourth motor unit is rotated in the counter-clockwise direction.

In this case, the first wire W1 and the second wire W2 move along an arrow direction shown in FIG. 11A. Accordingly, the second blocks BLK2_1 to BLK2_m, the third blocks BLK3_1 to BLK3_m, the first block BLK1 and the second first block BLK2_1, and the first block BLK1 and the third first block BLK3_1 are rotated with respect to the pin unit 30 such that the first distance D1 becomes narrow.

Figure 11B:
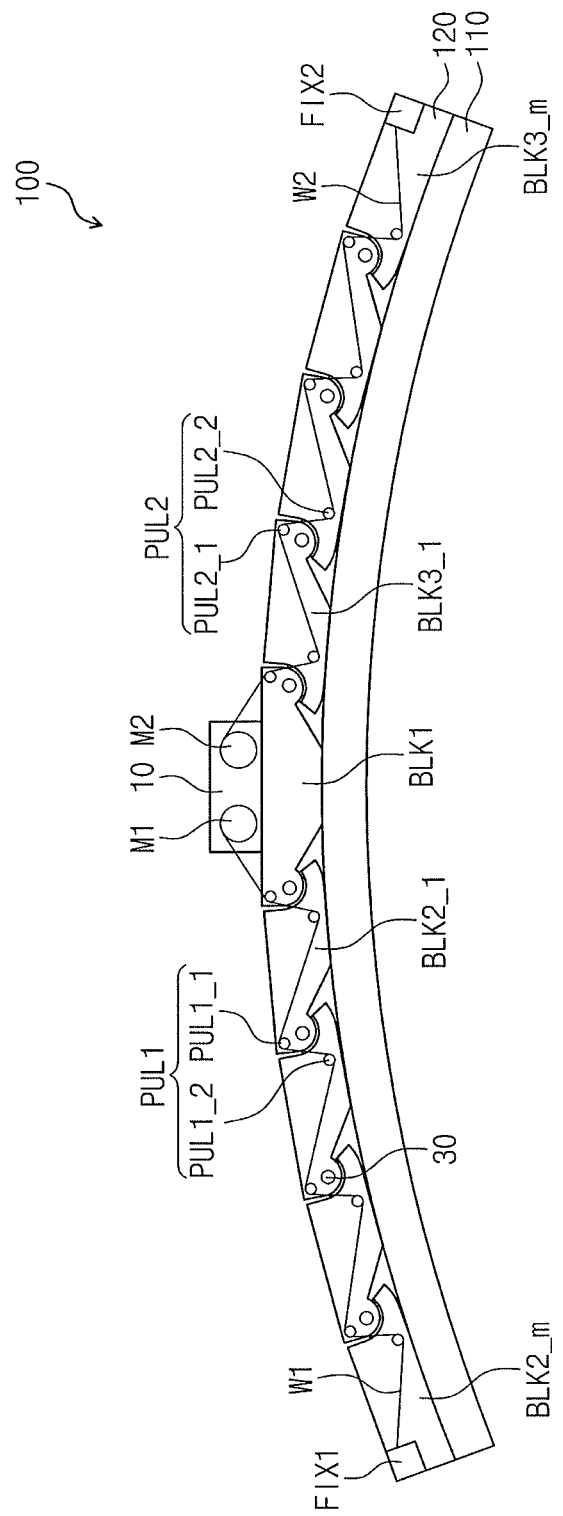

Referring to FIG. 11B, the second blocks BLK2_1 to BLK2_m, the third blocks BLK3_1 to BLK3_m, the first block BLK1 and the second first block BLK2_1, and the first block BLK1 and the third first block BLK3_1 move while being rotated such that the first distance D1 becomes narrow.

Figure 11C:
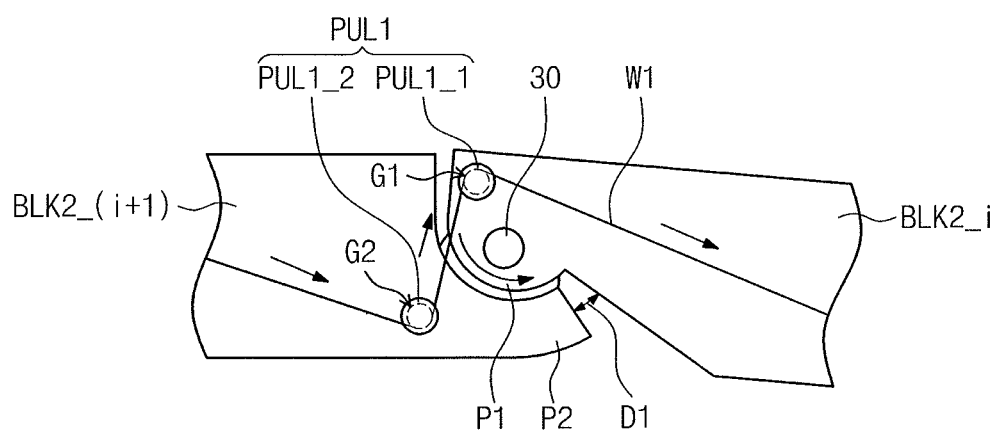

For the convenience of explanation, FIG. 11C shows an enlarged view of the second blocks BLK2_i and BLK2_(i+1) adjacent to each other. As shown in FIG. 11C, the second blocks BLK2_i and BLK2_(i+1) adjacent to each other are rotated with respect to the pin unit 30 and move. Therefore, the second blocks BLK2_i and BLK2_(i+1) adjacent to each other are rotated with respect to the pin unit 30 to be bent toward the display panel 110 at a predetermined angle.

Referring to FIG. 11B again, the second blocks BLK2_1 to BLK2_m adjacent to each other, the third blocks BLK3_1 to BLK3_m adjacent to each other, the first block BLK1 and the second first block BLK2_1 adjacent to each other, and the first block BLK1 and the third first block BLK3_1 adjacent to each other are rotated with respect to the pin unit 30, and they may be bent toward the direction in which the display panel 110 is disposed. As a result, the second blocks BLK2_1 to BLK2_m and the third blocks BLK3_1 to BLK3_m push out the display panel 110 as shown in FIG. 11B, so that the display panel 110 may be bent.

As a distance in which the blocks BLK1, BLK2_1 to BLK2, and BLK3_1 to BLK3_m move while being rotated increases, the first distance D1 decreases. Therefore, the blocks BLK1, BLK2_1 to BLK2_m, and BLK3_1 to BLK3_m adjacent to each other may be more bent toward the display panel 110.

The second blocks BLK2_1 to BLK2_m, the third blocks BLK3_1 to BLK3_m, the first block BLK1 and the second first block BLK2_1, and the first block BLK1 and the third first block BLK3_1 are set to have the first distance D1, but the distance of the second blocks BLK2_1 to BLK2_m, the third blocks BLK3_1 to BLK3_m, the first block BLK1 and the second first block BLK2_1, and the first block BLK1 and the third first block BLK3_1 should not be limited to the first distance D1. That is, the second blocks BLK2_1 to BLK2_m, the third blocks BLK3_1 to BLK3_m, the first block BLK1 and the second first block BLK2_1, and the first block BLK1 and the third first block BLK3_1 may be bent with different angles from each other. In this case, the areas of the display panel 110, which respectively correspond to the blocks BLK1, BLK2_1 to BLK2_m, and BLK3_1 to BLK3_m, may be individually bent with different angles.

Thus, the areas of the display panel 110, which respectively correspond to the blocks BLK1, BLK2_1 to BLK2_m, and BLK3_1 to BLK3_m, may be individually bent with different angles. As a result, the areas of the display panel 110 may be individually bent, which respectively correspond to the blocks BLK1, BLK2_1 to BLK2_m, and BLK3_1 to BLK3_m. Consequently, the display apparatus 100 may precisely control the bending angle of the display panel 110.

Figure 11D:
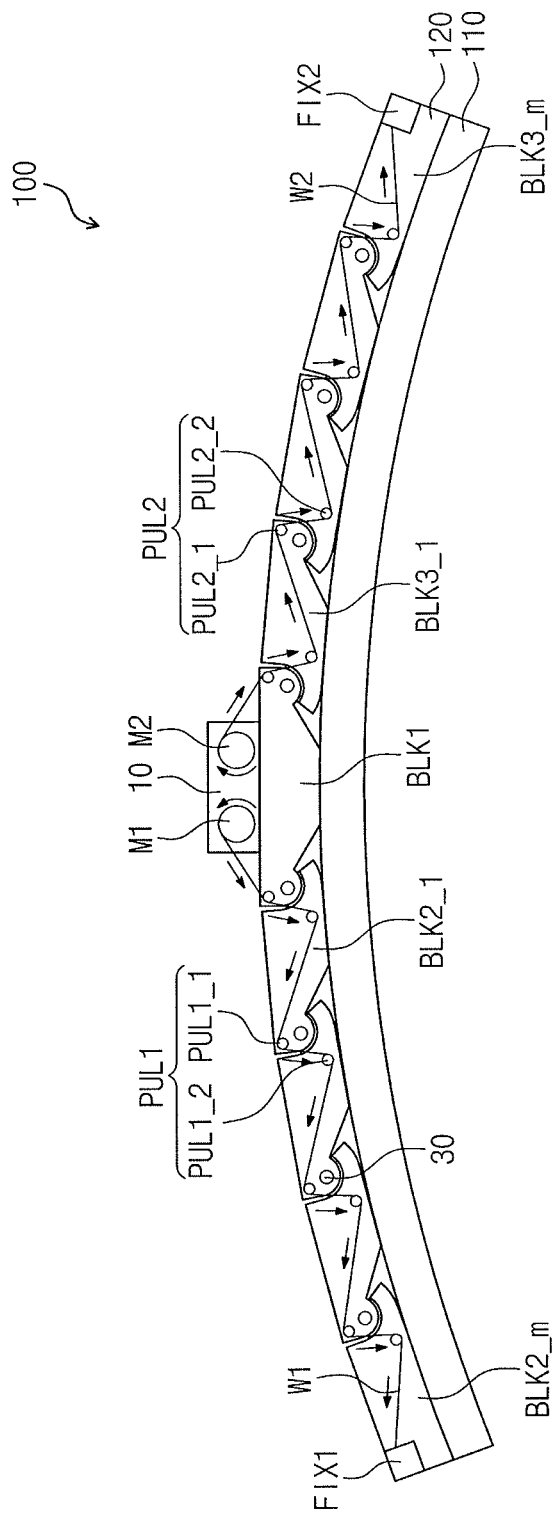
Figure 11E:
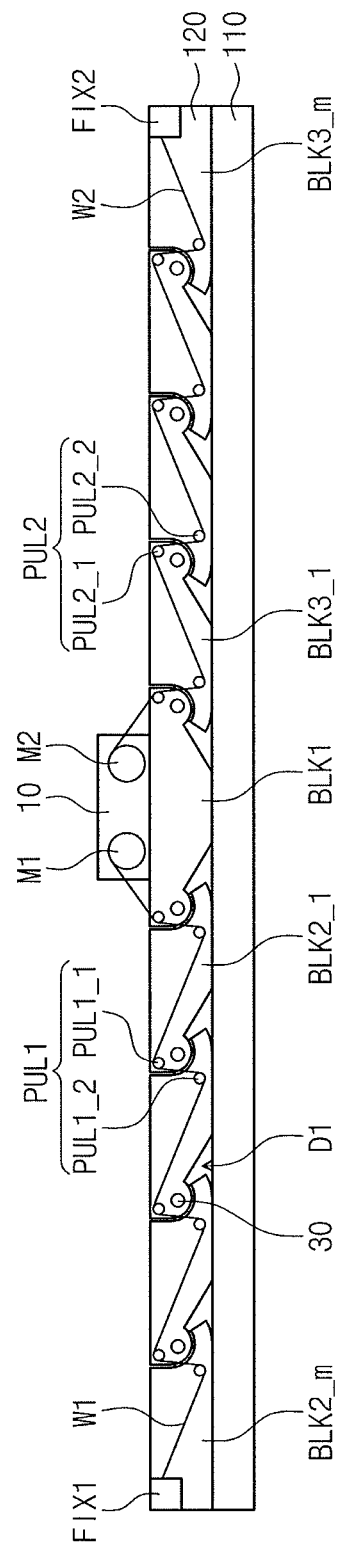

Referring to FIGS. 11D and 11E, the first motor unit M1 may be rotated in the counter-clockwise direction and the second motor unit M2 may be rotated in the clockwise direction. In this case, the first wire W1 and the second wire W2 move to the arrow direction shown in FIG. 11D. Accordingly, the blocks BLK1, BLK2_1 to BLK2_m, and BLK3_1 to BLK3_m return to original positions shown in FIG. 11A. Therefore, the display panel 110 returns to a flat state as shown in FIG. 11E.

Figure 12:
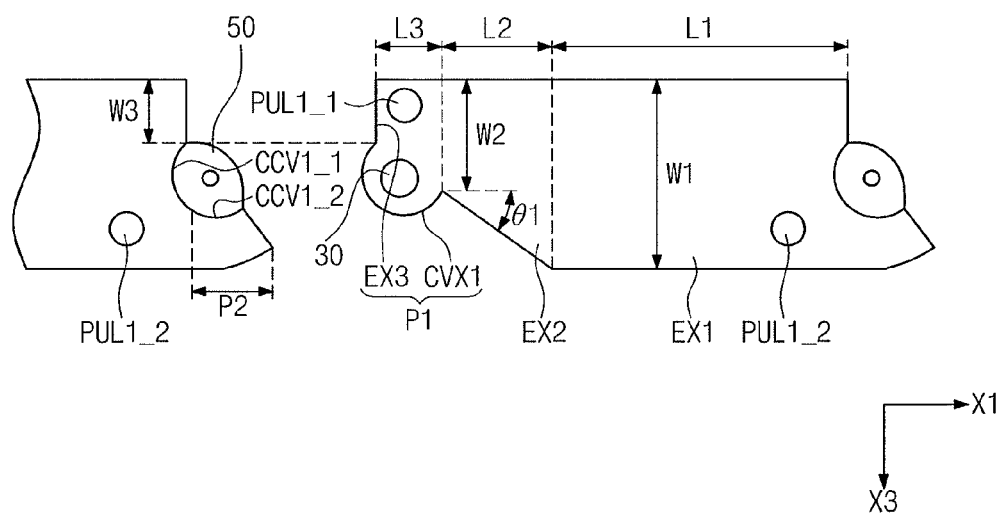
FIGS. 12 and 13 illustrate views of blocks of the bending control portion, which have different shapes and are adjacent to each other.
Figure 13:
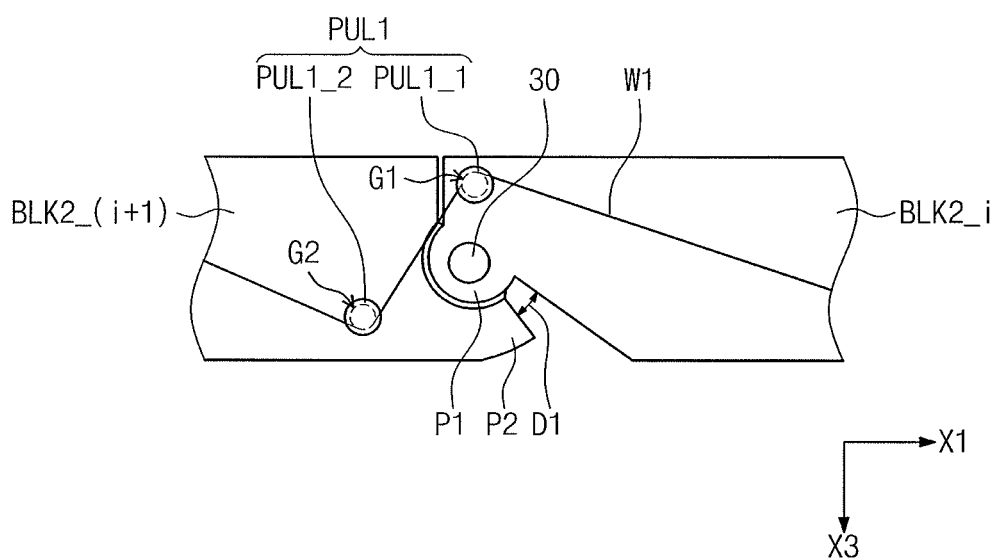

FIGS. 12 and 13 illustrate views showing blocks of the bending control portion, which have different shapes and are adjacent to each other.

The second blocks BLK2_i and BLK2_(i+1) shown in FIGS. 12 and 13 have the same configuration and function as those of the second blocks BLK2_i and BLK2_(i+1) shown in FIG. 7 except for the first protrusion portion P1 and the second protrusion portion P2.

Referring to FIGS. 12 and 13, the first protrusion portion P1 includes a third extension portion EX3 extended in the third direction X3 and a first convex portion CVX1 connected to the lower portion of the third extension portion EX3 in the third direction X3. The first convex portion CVX1 is more protruded to the first side direction than the first side surface of the third extension portion EX3 and has a convex arc shape in the third direction X3.

The first side of the third extension portion EX3 has a third width W3 smaller than a second width W2 in the third direction X3 and the second side of the third extension portion EX3 has the second width W2. The third extension portion EX3 has a third length L3 smaller than a second length L2 in the first direction X1.

Each of the second blocks BLK2_i and BLK2_(i+1) includes a first sub-concave portion CCV1_1 spaced apart from the rear surface of the first extension portion EX1 to the front surface of the first extension portion EX1 by the third width W3 and a second protrusion portion P2 connected to a lower portion of the first sub-concave portion CCV1_1 and extended in the first direction X1.

A surface of the second protrusion portion P2, which faces the display panel 110, is referred to as an outer side surface of the second protrusion portion P2, and an opposite surface to the outer side surface of the second protrusion portion P2 is referred to as an inner side surface of the second protrusion portion P2.

The inner side surface of the second protrusion portion P2 includes a second sub-concave portion CCV1_2 concaved to the third direction X3. The first sub-concave portion CCV1_1 and the second sub-concave portion CCV1_2 are connected to each other to face the first convex portion CVX1 and have the same curvature as that of the first convex portion CVX1. When viewed in an upper plan view, a sum of the length of the first sub-concave portion CCV1_1 and a length of the second sub-concave portion CCV1_2 is set to be smaller than the length of the first convex portion CVX1.

In the present exemplary embodiment, since other configurations of the second blocks BLK2_i and BLK2_(i+1) are the same as those of the second blocks BLK2_i and BLK2_(i+1) shown in FIG. 7, and thus detailed descriptions of the other configurations of the second blocks BLK2_i and BLK2_(i+1) will be omitted.

Figure 14:
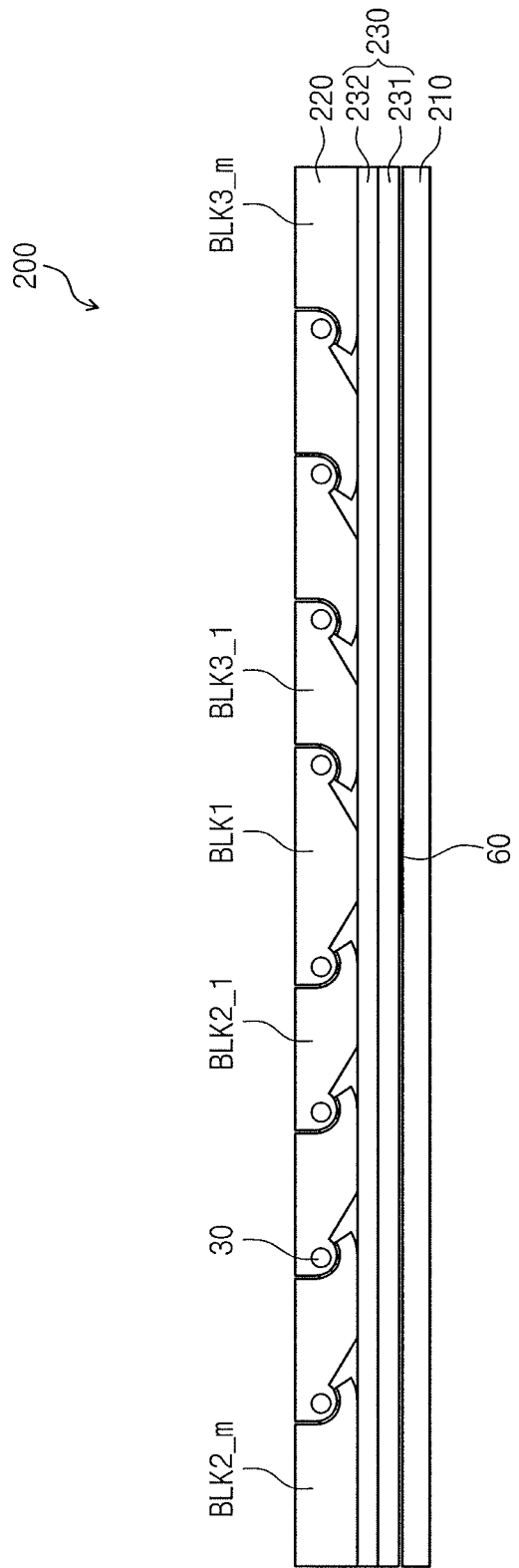
FIGS. 14 and 15 illustrate views of a display apparatus according to another exemplary embodiment of the present disclosure.
Figure 15:
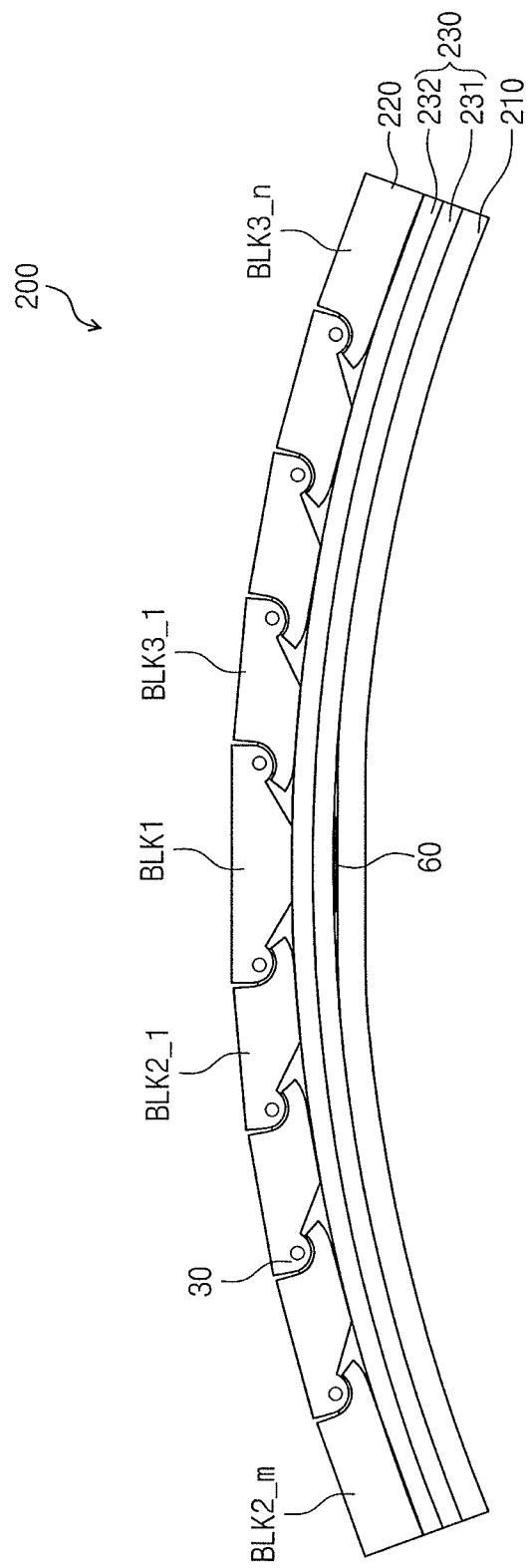

FIGS. 14 and 15 are views showing a display apparatus according to another exemplary embodiment of the present disclosure.

Referring to FIGS. 14 and 15, a display apparatus 200 may include a display panel 210, a bimetal unit 230 disposed at a rear side of the display panel 210, and a bending control portion 220 disposed at a rear side of the bimetal unit 230.

The bending control portion 220 may include a plurality of blocks BLK1, BLK2_1 to BLK2_m, and BLK3_1 to BLK3_m. The blocks BLK1, BLK2_1 to BLK2_m, and BLK3_1 to BLK3_m of the bending control portion 220 have the same configurations as those of the blocks BLK1, BLK2_1 to BLK2_m, and BLK3_1 to BLK3_m of the bending control portion 120 shown in FIG. 1. The bending control portion 220 shown in FIGS. 14 and 15 does not include the block driving units 10 and 20, the wire fixing units FIX1 and FIX2, the pulley units PUL1 and PUL2, and the wires W1 and W2 of the bending control portion 120 shown in FIG. 1.

The bimetal unit 230 may include a first bimetal unit 231 having a first expansion rate and a second bimetal unit 232 having a second expansion rate higher than the first expansion rate. The first bimetal unit 231 is disposed at the rear side of the display panel 210, the second bimetal unit 232 is disposed at the rear side of the first bimetal unit 231, and the bending control portion 220 is disposed at the rear side of the second bimetal unit 232.

The display panel 210 and the bimetal unit 230 have the same shape and are disposed to overlap with each other.

A center portion of the display panel 210 is connected to a center portion of the bimetal unit 230 through a connection portion 60. In detail, the center portion of the rear surface of the display panel 210 is connected to the center portion of the front surface of the bimetal unit 231 through the connection portion 60. Although not shown in figures, the connection portion 60 is extended in the second direction.

The bimetal unit 230 is disposed to overlap with the bending control portion 220. The rear surface of the bimetal unit 230 is connected to the front surface of the bending control portion 220. In detail, the rear surface of the second bimetal unit 232 is connected to the front surface of the blocks BLK1, BLK2_1 to BLK2_m, and BLK3_1 to BLK3_m of the bending control portion 220.

When a source voltage is applied to the first bimetal unit 231 and the second bimetal unit 232, the first and second bimetal units 231 and 232 may be expanded by a heat generated by the source voltage. The expansion rate of the second bimetal unit 232 is higher than the expansion rate of the first bimetal unit 231. Accordingly, the bimetal unit 230 is bent toward the display panel 210 as shown in FIG. 15.

When the bimetal unit 230 is bent, the second blocks BLK2_1 to BLK2_m, the third blocks BLK3_1 to BLK3_m, the first block BLK1 and the second first block BLK2_1, and the first block BLK1 and the third first block BLK3_1, which are connected to the bimetal unit 230, are rotated with respect to the pin unit 30 such that the first distance D1 becomes narrow.

Accordingly, the second blocks BLK2_1 to BLK2_m adjacent to each other, the third blocks BLK3_1 to BLK3_m adjacent to each other, the first block BLK1 and the second first block BLK2_1 adjacent to each other, and the first block BLK1 and the third first block BLK3_1 adjacent to each other may be rotated at a predetermined angle with respect to the pin unit 30 to be bent toward the direction in which the display panel 210 is disposed. As a result, areas of the bimetal unit 230, which respectively correspond to the blocks BLK1, BLK2_1 to BLK2_m, and BLK3_1 to BLK3_m, are individually bent at a predetermined angle. The bimetal unit 230 is bent toward the display panel 210, and thus the display panel 210 is bent. Therefore, portions of the display panel 210 may be individually bent by the bimetal unit 230 in areas respectively corresponding to the blocks BLK1, BLK2_1 to BLK2_m, and BLK3_1 to BLK3_m. Consequently, the display apparatus 200 may precisely control the bending angle of the display panel 210.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a flexible display panel configured to display an image; and
a bending control portion including a plurality of blocks on a rear side of the display panel, the plurality of blocks being connected to each other via pin units and rotated toward the display panel at a predetermined angle,
wherein first side surfaces of the blocks are spaced part from each other at a first distance, first side surfaces of the blocks being adjacent to front surfaces of the blocks facing the display panel,
wherein second side surfaces of the blocks are adjacent to each other and substantially parallel to each other, the second side surfaces of the blocks being adjacent to rear surfaces of the blocks opposite the front surfaces of the blocks, wherein the blocks are rotatable toward the display panel around the pin units with respect to a border therebetween, such that the first distance decreases, wherein the plurality of blocks includes:
- a first block connected to a center portion of the display panel,
- a plurality of second blocks disposed at a first side of the first block and arranged in a first direction, and
- a plurality of third blocks disposed at a second side of the first block and arranged in the first direction to be symmetrical with the second blocks, and wherein the bending control portion further includes a first and a second block driving units at an upper and at a lower portions of the rear surface of the first block and rotating the first block, the second blocks and the third blocks.

2. The display apparatus as claimed in claim 1, wherein the display panel is extended in the first direction to have long sides in the first direction and short sides in a second direction substantially vertical to the first direction, each of the blocks being extended in the second direction to have long sides in the second direction and short sides in the first direction, and the blocks' area being arranged in the first direction.

3. The display apparatus as claimed in claim 2, wherein the bending control portion further comprises:
- a plurality of first pulley units at upper and lower surfaces of the first block and the second blocks;
- a plurality of second pulley units at upper and lower surfaces of the first block and the third blocks;
- a plurality of first wire fixing units at the upper and lower surfaces of a last second block, which is positioned at an outermost position in the first side, among the second blocks;
- a plurality of second wire fixing units at the upper and lower surfaces of a last third block, which is positioned at an outermost position in the second side, among the third blocks;
- a plurality of first wires disposed at the upper and lower portions of the first block and the second blocks, each connected to a corresponding first wire fixing unit of the first wire fixing units, and connected to a first side of the first and second block driving units via the first pulley unit; and
- a plurality of second wires disposed at the upper and lower portions of the first block and the third blocks, each connected to a corresponding second wire fixing unit of the second wire fixing units, and connected to a second side of the first and second block driving units via the second pulley unit.

4. The display apparatus as claimed in claim 3, wherein the first pulley units include:
- a plurality of first first pulley units disposed adjacent to a rear surface of the first block and second sub-blocks having the second blocks, except for the last second block, and disposed at a first side of upper and lower surfaces of the first block and the second sub-blocks; and
- a plurality of first second pulley units disposed adjacent to a front surface of the second blocks and disposed at a second side of the upper and lower surfaces of the second blocks, the second pulley units including:
  - a plurality of second first pulley units disposed adjacent to a rear surface of the first block and third sub-blocks configured to include the third blocks, except for the last third block, and disposed at a second side of upper and lower surfaces of the first block and the third sub-blocks, and
  - a plurality of second second pulley units disposed adjacent to a front surface of the third blocks and at a first side of the upper and lower surfaces of the third blocks.

5. The display apparatus as claimed in claim 4, wherein:
- a predetermined area of the upper portion of the first block driving unit is disposed at a position higher than an upper boundary surface of the first block,
- a predetermined area of the lower portion of the second block driving unit is disposed at a position lower than a lower boundary surface of the first block,
- the first wire fixing units are disposed to the rear surface of the last second block and disposed at the first side of the upper and lower surfaces of the last second block, and
- the second wire fixing units are disposed to the rear surface of the last third block and disposed at the second side of the upper and lower surfaces of the last third block.

6. The display apparatus as claimed in claim 4, wherein:
- the first block driving unit includes a first motor unit disposed at the first side thereof and a second motor unit disposed at the second side thereof and rotated in an opposite direction to the first motor unit,
- the second block driving unit includes a third motor unit disposed at the first side thereof and a fourth motor unit disposed at the second side thereof and rotated in an opposite direction to the third motor unit, and
- the first motor unit is rotated in a same direction as the third motor unit, and the second motor unit is rotated in a same direction as the fourth motor unit.

7. The display apparatus as claimed in claim 6, wherein:
- a first end of each of the first wires is connected to a second side of a corresponding first wire fixing unit of the first wire fixing units, a second end of each of the first wires being connected to the first and third motor units, the first wires being disposed on side surfaces of the first first pulley units adjacent to the rear surface of the second sub-blocks and on side surfaces of the first second pulley units adjacent to the front surface of the second blocks, and
- one end of each of the second wires is connected to the second and fourth motor units, the other end of each of the second wires being connected to a first side of a corresponding second wire fixing unit of the second wire fixing units, and the second wires being disposed on side surfaces of the second first pulley units adjacent to the rear surface of the third sub-blocks and on side surfaces of the second second pulley units adjacent to the front surface of the third blocks.

8. The display apparatus as claimed in claim 7, wherein each of the first and second pulley units has a cylindrical shape, a diameter of an outer circumference surface of a center portion of each of the first and second pulley units being smaller than a diameter of an outer circumference surface of upper and lower sides of each of the first and second pulley units, and the first and second wires being on the outer circumference surface of the center portion of the first and second pulley units.

9. The display apparatus as claimed in claim 4, wherein each of the second sub-blocks includes:
- a first extension portion having a first width in a third direction substantially vertical to the first and second direction and a first length in the first direction;

a second extension portion connected to a first side of the first extension portion and having a second length smaller than the first length in the first direction;

a first protrusion portion having a third extension portion connected to a first side surface of the second extension portion and extended in the third direction, and a first convex portion connected to a lower portion of the third extension portion and having a convex arc shape convex to the third direction; and a second protrusion portion having a first concave portion connected to a second side of the first extension portion and extended in the first direction to face the first convex portion, the first concave portion having a concave shape concave to the third direction to have a same curvature as the first convex portion, wherein the last second block is configured to include the first extension portion and the second protrusion portion, a first side surface of the second extension portion has a second width smaller than the first width in the third direction, a second side surface of the second extension portion has the first width in the third direction, a front surface of the second extension portion is inclined at a first angle with respect to the first direction, a first side of the third extension portion has a third width smaller than the second width, and a second side of the third extension portion has the second width.

10. The display apparatus as claimed in claim 9, wherein;

rear surfaces of the first extension portion, the second extension portion, and the third extension portion are arranged lengthwise horizontally in the first direction, the third extension portion having a third length smaller than the second length in the first direction, a first side of the second protrusion portion is spaced apart from the rear surface of the first extension portion by the third width and connected to a second side of the first extension portion, the first concave portion having a length smaller than a length of the first convex portion when viewed in an upper plan view, the second side surface of the second protrusion portion being spaced apart from the front surface of the second extension portion by the first distance, and a second side surface of the first extension portion is disposed adjacent to and substantially in parallel to the first side surface of the third extension portion in an area corresponding to the third width from the rear surface of the first extension portion.

11. The display apparatus as claimed in claim 10, wherein each of the third sub-blocks includes:

a fourth extension portion having a same shape as the first extension portion and being disposed to be symmetrical with the first extension portion;

a fifth extension portion having a same shape as the second extension portion and being disposed to be symmetrical with the second extension portion;

a third protrusion portion having a same shape as the first protrusion portion and being disposed to be symmetrical with the first protrusion portion; and a fourth protrusion portion having a same shape as the second protrusion portion and being disposed to be symmetrical with the second protrusion portion, the third protrusion portion including:

a sixth extension portion having a same shape as the third extension portion and being disposed to be symmetrical with the third protrusion portion, and a second convex portion having a same shape as the first convex portion and being disposed to be symmetrical with the first convex portion, the fourth protrusion portion comprises a second concave portion having a same shape as the first concave portion and being disposed to be symmetrical with the first concave portion, and the last third block comprises the fourth extension portion and the fourth protrusion portion.

12. The display apparatus as claimed in claim 11, wherein:

each of the second and third blocks further comprises a block connection portion connected to the first concave portion and a second concave portion, the first protrusion portion is connected to upper and lower portions of the first side surface of the second extension portion, a portion of the first protrusion portion connected to the upper portion of the first side surface of the second extension portion is spaced apart from a portion of the first protrusion portion connected to the lower portion of the first side surface of the second extension portion by a second distance in the second direction, the third protrusion portion is connected to upper and lower portions of the first side surface of the fifth extension portion, a portion of the third protrusion portion connected to the upper portion of the first side surface of the fifth extension portion is spaced apart from a portion of the third protrusion portion connected to the lower portion of the first side surface of the fifth extension portion by the second distance in the second direction, and the block connection portion is extended in the second direction to have a length corresponding to the second distance in the second direction.

13. The display apparatus as claimed in claim 12, further comprising a pin coupling unit connected to a lower portion of each of the pin units and having a cylindrical shape, wherein the first and second blocks include a first hole extended in the second direction and having the cylindrical shape, the block connection portion includes a second hole extended from a center portion of a cross section of the block connection portion to the second direction and overlapped with the first hole, each of the pin units is inserted into the first hole and the second hole, the pin coupling unit is connected to a lower portion of each of the pin units in the second direction, the second blocks adjacent to each other and the third blocks adjacent to each other are rotated with respect to each of the pin units such that the first distance becomes narrow and the second and third blocks are bent to a direction in which the display panel is disposed at a predetermined angle.

14. The display apparatus as claimed in claim 13, wherein the first block includes:

a first sub-extension portion extended in the first direction;

a second sub-extension portion connected to a first side of the first sub-extension portion and having a same shape as the second extension portion;

a third sub-extension portion connected to a second side of the first sub-extension portion and configured to be symmetrical with the first sub-extension portion;

a first sub-protrusion portion connected to a first side of the second sub-extension portion and having a same shape as the first protrusion portion; and a second sub-protrusion portion connected to a second side of the third sub-extension portion and configured to be symmetrical with the first sub-protrusion portion, the first sub-protrusion portion is connected to the block connection portion of the second block adjacent thereto by each of the pin units, the second sub-protrusion portion is connected to the block connection portion of the third block adjacent thereto by each of the pin units, and the first and second blocks adjacent to each other and the first and third blocks adjacent to each other are rotated with respect to each of the pin units such that the first distance becomes narrow and the first, second, and third blocks are bent to the direction in which the display panel is disposed at the predetermined angle.

15. The display apparatus as claimed in claim 1, wherein each of the first first pulley units is disposed adjacent to the rear surface of the third extension portion and the rear surface of the first sub-protrusion portion at the first side of the third extension portion and the first side of the first sub-protrusion portion, each of the first second pulley units is disposed adjacent to the front surface of the first extension portion at the second side of the first extension portion, each of the second first pulley units is disposed adjacent to the rear surface of the sixth extension portion and the rear surface of the second sub-protrusion portion at the second side of the sixth extension portion and the second side of the second sub-protrusion portion, and each of the second second pulley units is disposed adjacent to the front surface of the fourth extension portion at the first side of the fourth extension portion.

16. The display apparatus as claimed in claim 4, wherein each of the second sub-blocks includes:
   a first extension portion having a first width in a third direction substantially vertical to the first and second directions and a first length in the first direction;
   a second extension portion connected to a first side of the first extension portion and having a second length smaller than the first length in the first direction;
   a first protrusion portion that includes a third extension portion connected to a first side of the second extension portion and extended in the third direction and a first convex portion connected to a lower portion of the third extension portion and having a convex arc shape that is more convex to the third direction than a first side surface of the third extension portion; and
   a first sub-concave portion spaced by a predetermined distance from the rear surface of the first side of the first extension portion to the front surface of the first extension portion and having a concave shape; and
   a second protrusion portion connected to a lower portion of the first sub-concave portion and extended in the first direction, the last second block is configured to include the first extension portion, the first sub-concave portion, and the second protrusion portion, an inner side surface of the second protrusion portion comprises a second sub-concave portion having a concave shape concave to the third direction, and the first and second sub-concave portions are connected to each other to face the first convex portion and have a concave shape with a same curvature as the first convex portion.

17. The display apparatus as claimed in claim 16, wherein:
   a first side surface of the second extension portion has a second width smaller than the first width in the third direction, a second side surface of the second extension portion having the first width in the third direction, and a front surface of the second extension portion being inclined with respect to the first direction at a first angle,
   a first side of the third extension portion has a third width smaller than the second width, a second side of the third extension portion having the second width,
   the first concave portion is spaced apart from the rear surface of the first side of the first extension portion to the front surface direction of the first extension portion by the third width, rear surfaces of the first extension portion, the second extension portion, and the third extension portion being arranged lengthwise horizontally in the first direction,
   the third extension portion has a third length smaller than the second length in the first direction, a sum of a length of the first sub-concave portion and a length of the second sub-concave portion being smaller than a length of the first convex portion when viewed in an upper plan view, the second side surface of the second protrusion portion being spaced apart from the front surface of the second extension portion by the first distance, and a second side surface of the first extension portion being adjacent to and substantially in parallel to the first side surface of the third extension portion in an area corresponding to the third width from the rear surface of the first extension portion.

18. A display apparatus, comprising:
   a flexible display panel configured to display an image;
   a first bimetal unit at a rear side of the flexible display panel and having a first expansion rate;
   a second bimetal unit at a rear side of the first bimetal unit and having a second expansion rate greater than the first expansion rate;
   a bending control portion at a rear side of the second bimetal unit and including a plurality of blocks connected to the second bimetal unit, the plurality of blocks being connected to each other via pin units; and
   a connection portion connecting a center portion of the flexible display panel and a center portion of the first bimetal unit,
   wherein side surfaces of the blocks, which are adjacent to front surfaces of the blocks facing the second bimetal unit, are spaced part from each other at a first distance, side surfaces of the blocks, which are adjacent to rear surfaces of the blocks, are disposed adjacent to each other and substantially in parallel to each other, and the blocks are rotated to the display panel with respect to a border therebetween such that the first distance becomes narrow,
   wherein the plurality of blocks includes:
      a first block connected to a center portion of the display panel,
      a plurality of second blocks disposed at a first side of the first block and arranged in a first direction, and
      a plurality of third blocks disposed at a second side of the first block and arranged in the first direction to be symmetrical with the second blocks, and
   wherein the bending control portion further includes a first and a second block driving units at an upper and at a lower portions of the rear surface of the first block and rotating the first block, the second blocks and the third blocks.

19. The display apparatus as claimed in claim 18, wherein: the bending control portion further includes:
   a plurality of first pulley units disposed at upper and lower surfaces of the first block and the second blocks,
   a plurality of second pulley units disposed at upper and lower surfaces of the first block and the third blocks,
   a plurality of first wire fixing units disposed at the upper and lower surfaces of a last second block, which is positioned at an outermost position in the first side, among the second blocks,
   a plurality of second wire fixing units disposed at the upper and lower surfaces of a last third block, which is positioned at an outermost position in the second side, among the third blocks, a plurality of first wires disposed at the upper and lower portions of the first block and the second blocks, each connected to a corresponding first wire fixing unit of the first wire fixing units, and connected to a first side of the first and second block driving units via the first pulley unit, and a plurality of second wires disposed at the upper and lower portions of the first block and the third blocks, each connected to a corresponding second wire fixing unit of the second wire fixing units, and connected to a second side of the first and second block driving units via the second pulley unit.

\* \* \* \* \*